(12) United States Patent
Hideyoshi et al.

(10) Patent No.: US 7,164,157 B2
(45) Date of Patent: *Jan. 16, 2007

(54) LIGHT EMITTING DEVICE AND LIGHT EMITTING DEVICE MODULE

(75) Inventors: Horie Hideyoshi, Ushiku (JP); Satoru Nagao, Ushiku (JP); Yoshitaka Yamamoto, Ushiku (JP); Toshinari Fujimori, Ushiku (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/253,547

(22) Filed: Oct. 20, 2005

(65) Prior Publication Data

US 2006/0038185 A1 Feb. 23, 2006

Related U.S. Application Data

(60) Division of application No. 09/860,828, filed on May 21, 2001, which is a continuation of application No. PCT/JP00/03947, filed on Jun. 16, 2000.

(30) Foreign Application Priority Data

Sep. 22, 1999 (JP) ................................. 11/268542
Sep. 22, 1999 (JP) ................................. 11/268543

(51) Int. Cl.
*H01L 33/00* (2006.01)
(52) U.S. Cl. ...................................... 257/98
(58) Field of Classification Search ............ None
See application file for complete search history.

(56) References Cited

U.S. PATENT DOCUMENTS 5,566,198 A 10/1996 Horie et al. ............... 372/46

(Continued)

FOREIGN PATENT DOCUMENTS

EP 0 227 865 7/1987

(Continued)

OTHER PUBLICATIONS

Naoki Chinone et al.: "Mode-Hopping Noise in Index-Guided Semiconductor Lasers and Its Reduction by Saturable Absorbers," *IEEE Journal of Quantum Electronics*, vol. QE-21, No. 8, pp. 1264-1270, Aug. 1985.

(Continued)

*Primary Examiner*—Wai-Sing Louie
(74) *Attorney, Agent, or Firm*—Armstrong, Kratz, Quintos, Hanson & Brooks, LLP

(57) ABSTRACT

A light emitting device including a substrate transparent at the emission wavelength and an active layer structure formed on such substrate, in which the thickness of the substrate is 75 μm or less, and/or a layer for suppressing spectral-intensity-modulation due to the substrate-mode is provided between the substrate and the active layer structure. Such device can suppress the spectral-intensity-modulation due to the substrate-mode, which is observed for the case the substrate is transparent at the emission wavelength, to thereby provide a light emission device excellent in linearity of the current-light output characteristics, and to thereby improve the coupling characteristics with an external cavity.

26 Claims, 12 Drawing Sheets

U.S. PATENT DOCUMENTS

| | | | |
|---|---|---|---|
| 5,619,518 A | 4/1997 | Horie et al. | 372/46 |
| 5,675,601 A | 10/1997 | Karakida et al. | 372/46 |
| 5,793,062 A | 8/1998 | Kish, Jr. et al. | 257/98 |
| 5,838,028 A | 11/1998 | Horie et al. | 257/183 |
| 5,870,417 A | 2/1999 | Verdiell et al. | 372/32 |
| 5,920,767 A | 7/1999 | Horie et al. | 438/40 |
| 6,005,263 A | 12/1999 | Saito et al. | 257/200 |
| 6,130,147 A | 10/2000 | Major et al. | 438/604 |
| 6,172,998 B1 | 1/2001 | Horie et al. | 372/46 |
| 6,323,052 B1 | 11/2001 | Horie et al. | 438/46 |
| 6,677,618 B1 | 1/2004 | Horie et al. | 257/94 |
| 6,744,074 B1 | 6/2004 | Horie et al. | 257/88 |
| 6,791,181 B1 | 9/2004 | Horie et al. | 257/706 |
| 2002/0014674 A1* | 2/2002 | Hideyoshi et al. | 257/458 |

FOREIGN PATENT DOCUMENTS

| | | |
|---|---|---|
| EP | 0 744 799 | 11/1996 |
| JP | 1-292874 | 11/1989 |
| JP | 2-170486 | 7/1990 |
| JP | 08-037340 | 2/1996 |
| JP | 08-228048 | 9/1996 |
| JP | 09-214048 | 8/1997 |
| JP | 10-209570 | 8/1998 |
| JP | 10-242565 | 9/1998 |
| JP | 10-303459 | 11/1998 |

OTHER PUBLICATIONS

Ivan A. Avrutsky et al.: "Investigations of the Spectral Characteristics of 980-nm InGaAs-GaAs-AlGaAs Lasers," *IEEE Journal of Quantum Electronics*, vol. 33, No. 10, pp. 1801-1809, Oct. 1997.

M. Sugo et al.: "Development of 1.02-µm pump laser diodes," *OSA TOPS on Optical Amplifiers and Their Applications*, vol. 5, pp. 101-104, 1996.

Shuji Nakamura et al.: "Room-temperature continuous-wave operation of InGaN multi-quantum-well structure laser diodes with a lifetime of 27 hours," *Appl. Phys. Lett.* 70 (11), Mar. 17, 1997, pp. 1417-1419.

U.S. Appl. No. 11/082,906.

U.S. Appl. No. 11/072,273.

Hideyoshi Horie et al.: "Reliability Improvement of 980-nm Laser Diodes with a New Facet Passivation Process," *IEEE Journal of Selected Topics in Quantum Electronics*, vol. 5, No. 3, May/Jun. 1999, pp. 832-838.

P. G. Eliseev et al.: "Analysis of the Mode Internal Coupling in InGaAs/GaAs Laser Diodes," *Laser Physics*, vol. 4, No. 3, 1994, pp. 485-492.

* cited by examiner

US 7,164,157 B2

LIGHT EMITTING DEVICE AND LIGHT EMITTING DEVICE MODULE

RELATED APPLICATIONS

This application is a divisional application of U.S. application Ser. No. 09/860,828, filed on May 21, 2001, the entire contents of which is incorporated herein by reference, which is a continuation application of International Application No. PCT/JP00/03947, filed on Jun. 16, 2000.

BACKGROUND OF THE INVENTION

1. Field of the Invention

The present invention relates to a light emitting device and a light emitting device module containing such light emitting device. The present invention is successfully applicable to a semiconductor laser device such as an excitation light source for an optical fiber amplifier. It is also applicable to light emitting devices such as an LED and a super-luminescent diode.

2. Description of the Related Art

Remarkable progress has been made in recent technologies for optical information processing and optical communication. For example, to accomplish bi-directional communication on an optical fiber network at a high-speed and in a large capacity communication such as that in imaging transmission, a signal amplifier flexibly adaptable to the transmission system thereof, as well as a large-capacity optical fiber transmission path, is indispensable. A rare earth ion doped optical fiber amplifier such as $Er^{3+}$ doped fiber amplifier (EDFA) is one of the typical examples under competitive investigations in the fields concerned. Thus there is a large expectation to the development of an excellent semiconductor laser for an excitation light source, which is indispensable as an EDFA component.

The excitation light source may, in principle, have three possible oscillation wavelengths of 800 nm, 980 nm and 1480 nm. It is known from the aspect of performance of the amplifier that the excitation at 980 nm is the best, taking the gain and noise-figure into account. A laser diode having a wavelength in the 980-nm band is materialized easily by employing a GaAs substrate and an InGaAs active layer stacked thereon, in which contradictory requirements for high output and long life must be satisfied. Because there is also a requirement for an SHG (secondary harmonic generation) light source in a wavelength range around 980 nm, more specifically, a range from 890 to 1150 nm, development of a laser diode showing excellent properties in various applications is desirable.

In the field of information processing, recent trends prefer shorter wavelength of a semiconductor laser diode in order to achieve high density storage. In particular, a recent blue laser diode makes remarkable progress. This is exemplified as a GaN-base material layer grown on a substrate made of $AlO_x$ or the like, which gains improved reliability and is under further investigations.

Critical characteristics required for an exemplary laser diode fabricated on a GaAs substrate for 980-nm-band emission, beside the foregoing high output and high reliability, include stability in light output, linearity in the current-light output characteristics, and stability in the oscillation wavelength. A reason why the stability in the light output is a matter of greatest importance relates to a fact that fluctuation in the degree of excitation of $Er^{3+}$ doped fiber directly results in fluctuation in the gain of the optical amplifier per se. An excellent linearity in the current-light output characteristics is necessary for controlling the laser diode in order to ensure a constant output even under fluctuation in the external environment such as temperature. Another importance resides in the stability in the oscillation wavelength, because an absorption band of $Er^+$ doped fiber is narrow.

It is, however, quite usual for a semiconductor laser diode to cause fluctuation in the intensity noise, or fluctuation in light output, which is ascribable to fluctuation in the longitudinal-mode. Such observation is known as a mode-hopping noise, and is reported by a number of literatures. An example of the substrate showing absorption at the oscillation wavelength can be found in a 780-nm-band laser diode having an AlGaAs active layer on a GaAs substrate (Journal of Quantum Electronics, Vol. 21, No. 8, p. 1264–1270, August 1985). As is described in the literature, a device having a plurality of competitive longitudinal-modes tends to cause hopping of the oscillation wavelength between the modes relatively close to each other, for example, between adjacent Fabry-Perot modes defined by a cavity length. The above literature describes that the mode-hopping occurs in a width of 0.2 to 0.3 nm, which causes the intensity noise of a semiconductor laser diode since different oscillation wavelengths give different gains. This is observed as fluctuation (non-linearity) in the current-light output characteristics of the laser diode even when the waveguide is designed to oscillate in a single transverse-mode.

Another problem is also pointed out in that the mode-hopping is associated with hysteresis, and the oscillation wavelength will differ depending on the temperature history or injected current history even when the device is operated at a constant light output mode.

In addition to such mode-hopping, a larger intensity noise having a large wavelength spacing as compared with that in the previously reported laser diodes is observed when the substrate is transparent at the wavelength of the light emitted from the active layer (which is typical for a laser diode emitting light around 980 nm in which a GaAs substrate is transparent to light emitted from an InGaAs active layer). The reason is as follows (Journal of Quantum Electronics, Vol. 33, No. 10, p. 1801–1809, October 1997).

Light leaking downward from the active layer is guided within the substrate rather than being absorbed by such substrate. This is because the substrate has a refractive index greater than that of a clad layer contained in the device structure, and is transparent at the emission wavelength. Hence, a substrate-mode will appear. In particular, a higher-mode thereof can readily couple with a general Fabry-Perot mode guided through a laser structure fabricated on the substrate. Because the substrate generally has a thickness of 100 to 150 µm, intensity modulation with approx. 2 to 3 nm mode-spacing is observed in the spectrum. That is, longitudinal-modes which can oscillate relatively easily appear at a spacing of 2 to 3 nm and show mode-competition.

When the longitudinal-mode spacing becomes larger, the laser gains grow further apart. The mode-competition hardly occurs between the modes extremely distant from each other by as far as 10 nm. On the contrary, a mode spacing 2 to 3 nm is not so large enough to forbid the mode-competition, while causing a relatively large difference in the gains, and is causative of extremely large intensity noise as compared with the mode-hopping between the adjacent Fabry-Perot modes. That is, the competition of the longitudinal-mode and spectral-intensity-modulation due to the mode propagating in a transparent substrate which has a larger refractive index than the cladding layers, which is referred to as "substrate-mode" hereinafter, will be more responsible for the intensity noise than the general mode-hopping between Fabry-Perot modes observed for the substrate showing absorption at the emission wavelength.

Stability in the wavelength is another critical issue when the device is to be applied, for example, to an excitation light source for an EDFA. Another problem arises in that such a laser diode, affected by the competition of the longitudinal-mode and spectral-intensity-modulation due to the resonant mode coupling between the ordinary mode in a laser waveguide (laser-mode) and substrate-mode, can exhibit only a limited effect of wavelength stabilization even when coupled with an external cavity such as a grating fiber used for stabilizing the wavelength.

Based on consideration on the foregoing problems in the conventional technology, an object of the present invention is to suppress the competition of the longitudinal mode and spectral-intensity-modulation due to the substrate mode, which are observed for the case the substrate is transparent at the emission wavelength, to thereby provide a light emission device excellent in linearity of the current-light output characteristics, and to thereby improve the coupling characteristics with an external cavity. It is also an object of the present invention to provide a module with a light emitting device capable of operating in a stable manner over a wide range of temperature and output.

SUMMARY OF THE INVENTION

The present inventors discovered after extensive investigations for solving the foregoing problems that the object of the present invention can be accomplished by a light emitting device comprising a substrate transparent at the emission wavelength and an active layer structure formed on such substrate, in which a layer for suppressing spectral-intensity-modulation due to the substrate-mode is provided between the substrate and the active layer structure, and/or the thickness of the substrate is 75 µm or less.

A first embodiment of the light emitting device according to the present invention further comprises a first-conduction-type clad layer having the same conduction type with the substrate and formed between the substrate and the active layer structure; and a first-conduction-type, low-refractive-index layer formed between the substrate and the first-conduction-type clad layer; wherein a relation expressed by the following (inequality 1)

$$n_{sub} > n_{clad1} > n_{LIL1}$$ (inequality 1)

is satisfied, where $n_{sub}$ represents the refractive index at the emission wavelength of the substrate, $n_{clad1}$ represents the real part of an average refractive index at the emission wavelength of the first-conduction-type clad layer, and $N_{LIL1}$ represents the average refractive index at the emission wavelength of the first-conduction-type, low-refractive-index layer. It is preferable that the thickness $T_{LIL1}$ of the first-conduction-type, low-refractive-index layer and the emission wavelength λ satisfy the following (inequality 2):

$$T_{LIL1} > \lambda/20$$ (inequality 2)

The thickness of the first-conduction-type clad layer is preferably 2.0 to 3.5 µm.

The first embodiment is further preferable if the light emitting device further comprises a second-conduction-type clad layer formed on the active layer structure; a second-conduction-type, low-refractive-index layer formed on the second-conduction-type clad layer; and a contact layer formed on the second-conduction-type, low-refractive-index layer; wherein a relation expressed by the following (inequality 3)

$$n_{cont} > n_{clad2} > n_{LIL2}$$ (inequality 3)

is satisfied, where $n_{clad2}$ represents the refractive index at the emission wavelength of the second-conduction-type clad layer, $n_{LIL2}$ represents the refractive index at the emission wavelength of the second-conduction-type, low-refractive-index layer, and $n_{cont}$ represents a refractive index at the emission wavelength of the contact layer. It is preferable that the thickness $T_{LIL2}$ of the second-conduction-type, low-refractive-index layer and the emission wavelength λ satisfy the following (inequality 4):

$$T_{LIL2} > \lambda/20$$ (inequality 4)

A second embodiment of the light emitting device according to the present invention is exemplified as that having the substrate of 75 µm thick or thinner. The thickness of the substrate is more preferably 50 µm or below.

The present invention also provides a module having the foregoing light emitting device. The light emitting device module of the present invention preferably has an external cavity in the light emitting direction, and oscillates only at a single wavelength. The external cavity is preferably composed as a grating fiber selectively reflecting light of a predetermined wavelength in the light emitting direction of the light emitting device, and such grating fiber preferably has a reflectance toward the incident side of 2 to 25% at the laser oscillation wavelength, and a reflection band extending as far as 0.1 to 5.0 nm on both sides of the center wavelength.

BRIEF DESCRIPTION OF THE DRAWINGS

The above and other objects and features of the invention are apparent to those skilled in the art from the following referred embodiments thereof when considered in conjunction with the accompanied drawings, in which.

DETAILED DESCRIPTION OF THE PREFERRED EMBODIMENTS

The light emitting device and the light emitting device module of the present invention will be detailed hereinafter.

The light emitting device of the present invention comprises at least a substrate and an active layer structure formed thereon, where the substrate has a refractive index greater than that of a clad layer owned by such light emitting device and is transparent at the emission wavelength. A layer for suppressing spectral-intensity-modulation due to the substrate-mode is provided between the substrate and the active layer structure, and/or the thickness of the substrate is 75 μm or less. Forming the layer for suppressing spectral-intensity-modulation and controlling the substrate thickness may be a matter or alternative choice, or may be combined. Most preferable is a single selection of the formation of the layer for suppressing spectral-intensity-modulation, or the combination of two such measures.

Figure 1:
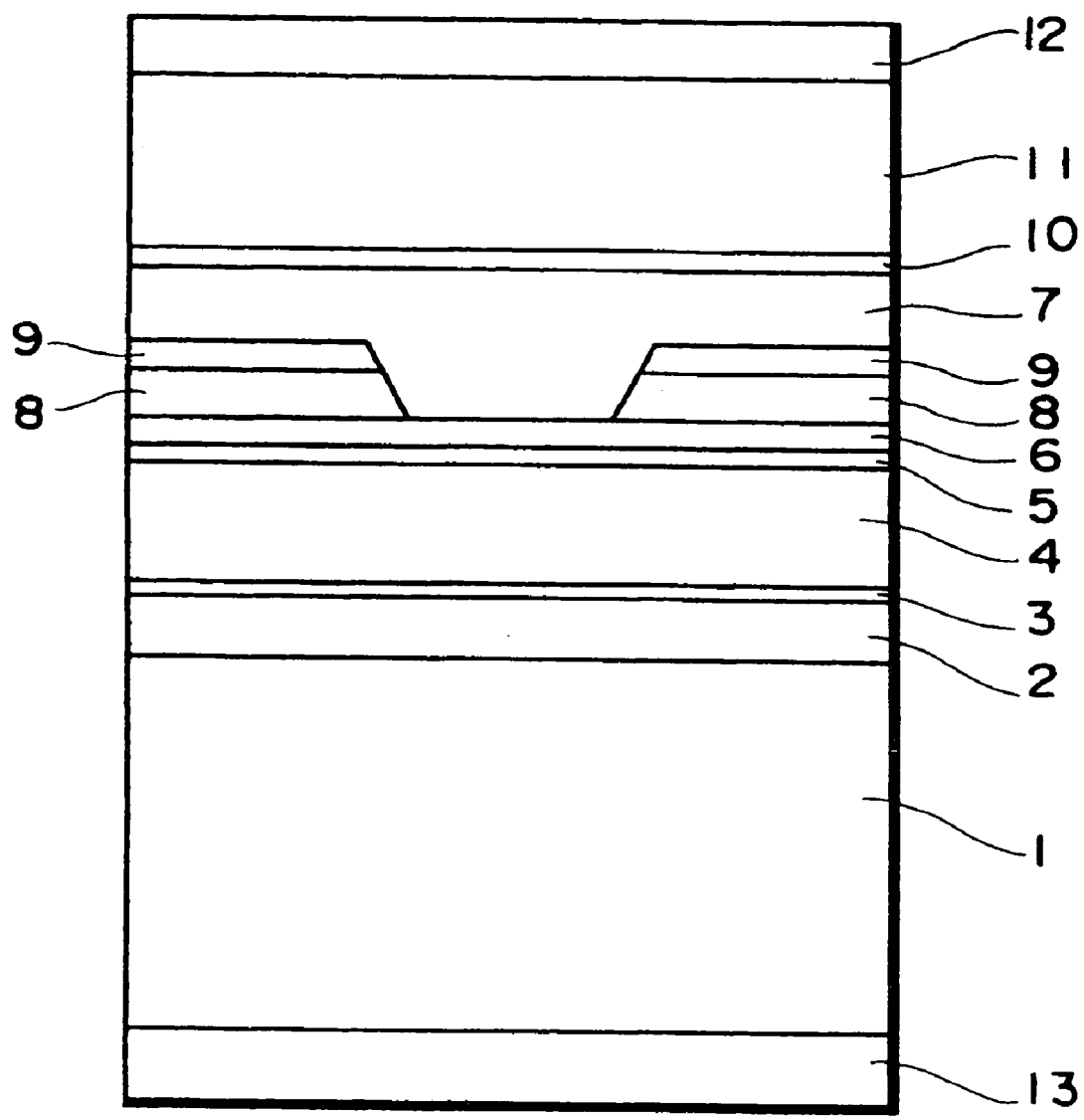
FIG. 1 is a schematic sectional view showing one embodiment of a light emitting device according to the present invention.
Figure 2:
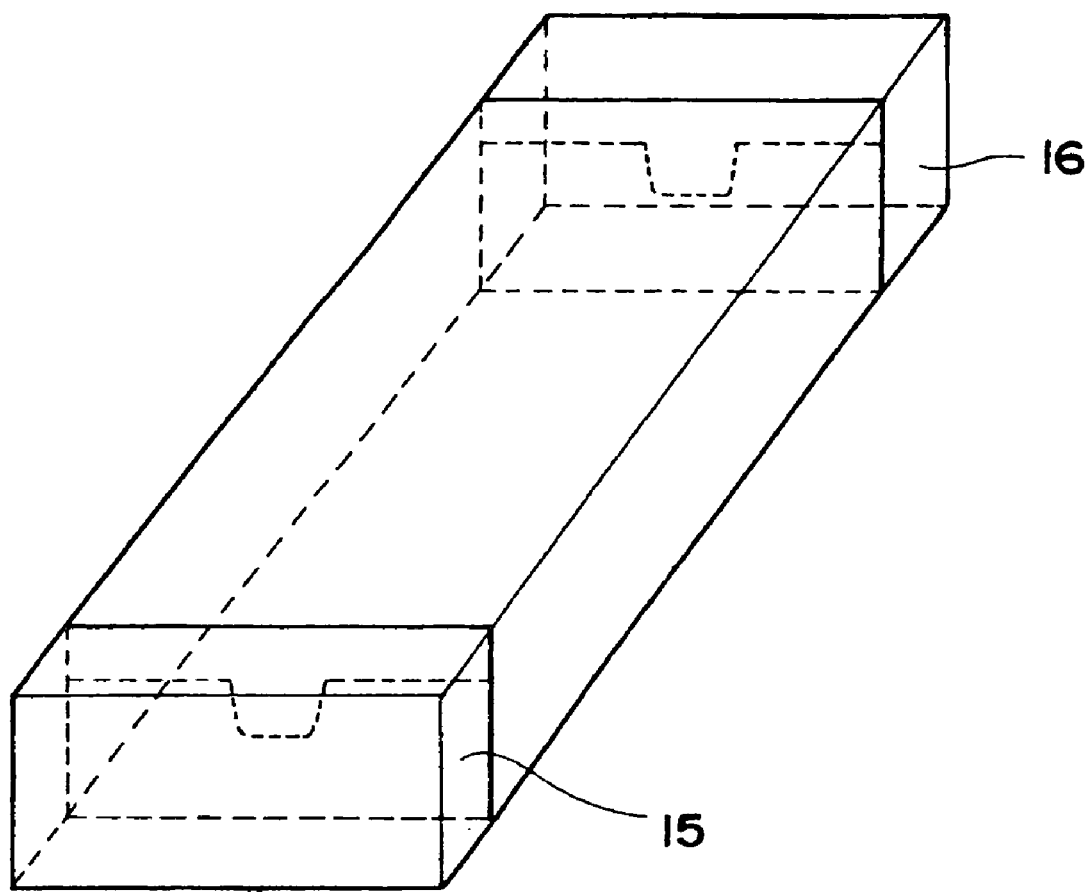
FIG. 2 is a perspective view showing one embodiment of a light emitting device according to the present invention.

The light emitting device of the present invention will now be explained referring to FIGS. 1 and 2 schematically showing a groove-type semiconductor laser diode.

As shown in FIG. 1, the semiconductor laser diode has, on a substrate 1, a buffer layer 2, a first-conduction-type, low-refractive-index layer 3, a first-conduction-type clad layer 4, an active layer structure 5 and a second-conduction-type first clad layer 6 stacked in this order; and further has, on such second-conduction-type first clad layer 6, a current block layer 8 and a cap layer 9 both of which having in the center portion thereof a stripe-patterned groove. On such cap layer 9, a second-conduction-type second clad layer 7 is formed so as to fill the stripe-patterned groove, and further thereon a second-conduction-type, low-refractive-index layer 10 and a contact layer 11 is formed in this order. Electrodes 12, 13 are formed on the top surface of the contact layer 11 and the back surface of the substrate 1, respectively. The device further has coated layers 15, 16 on both facets thereof as shown in FIG. 2.

It should now be noted that an expression "the layer B formed on the layer A" includes both cases in which the layer B is formed so as to contact the bottom plane thereof with the top plane of the layer A, and in which the layer B is formed over the layer A while being inserted by one or more other layers. The above expression also includes the case in which the top plane of the layer A and the bottom plane of the layer B partially come into contact, but inserted by one or more other layers in the residual portion. Specific embodiments will be made clear referring to the explanation of the individual layers and preferred Examples.

The substrate 1 must have a refractive index greater than that of the first-conduction-type clad layer 4, and must be transparent at the emission wavelength. A GaAs single-crystalline substrate is preferably used as the substrate in view of a desired oscillation wavelength, lattice matching, strain intentionally introduced into the active layer or so, and compensation of strain in the active layer applied to the guide layer or so. GaAs is preferable in view of lattice matching with a group III-V semiconductor laser diode containing As, P or the like as a Group V element. I should now be noted in this specification that Group of elements expressed in Roman numerals follows the conventional nomenclature.

Available substrates include not only a just-angled substrate but also an off-angled substrate in order to improve crystallinity in epitaxial growth. The off-angled substrate is widely used since it has an effect of promoting crystal growth in the step flow mode. While an angle of inclination of approx. 0.5 to 2° is most popular for the off-angled substrate, the angle of inclination around 10° is also allowable depending on the material system composing a quantum-well structure.

The substrate may previously be subjected to chemical etching or heat treatment for the convenience of the fabrication of the semiconductor laser diode using crystal growth methods such as MBE (molecular beam epitaxy) and MOCVD (metal organic chemical vapor deposition).

There is no special limitation on the thickness of the substrate for the case that the layer for suppressing spectral-intensity-modulation due to the substrate-mode is provided between the substrate and the active layer structure. The thickness is generally selected within a range from 100 to 150 μm in view of mechanical strength. It is, however, also allowable to reduce the thickness as small as 75 μm or below, and more preferably 50 μm or below, for the case that further improvement in the linearity in the light output is desired. For example, a substrate of 50 μm thick or around will extremely enlarge the wavelength spacing caused by an intensity-modulation due to the substrate-mode to as large as 7 to 9 nm, where the difference between gains in two modes increases due to a considerable suppression in one of two gains, which eventually suppress spectral-intensity-modulation in a successful manner.

On the other hand, for the case that the layer for suppressing spectral-intensity-modulation due to the substrate-mode is not provided between the substrate and the active layer structure, the thickness of the substrate is limited to 75 μm or below, and more preferably 50 μm or below. There is no specific limitation on a method for fabricating a light emitting device using such a relatively thin substrate. That is, the light emitting device may be fabricated by preliminarily producing a substrate having a thickness of 75 μm or above and then forming thereon other layers; or by forming other layers on a substrate having a thickness exceeding 75 μm and then polish the substrate to reduce the thickness as thin as 75 μm or below. The latter method is more preferable since a substrate having a thickness of 75 μm or less generally lacks mechanical strength.

The buffer layer 2 is preferably provided to improve the crystallinity of the bulk substrate, and to facilitate the formation of epitaxial coatings which are grown while keeping an identical crystal axis. The buffer layer 2 is preferably composed of a material same as that for the substrate 1, which is generally GaAs. It is, however, also widely practiced to use a super-lattice structure for the buffer layer 2, which is an exemplary case of using different materials. On the other hand, it is not always necessary to use the same material with that for the substrate when the substrate is made of a dielectric material, and a material may appropriately be selected depending on the emission wavelength or the entire device structure.

One specific feature of the light emitting device of the present invention resides in that the layer for suppressing spectral-intensity-modulation due to the substrate-mode is provided between the substrate and the active layer structure. The layer for suppressing spectral-intensity-modulation in the context of the present invention does not limit the compositional material, shape and thickness thereof so far as such layer can suppress leakage of light from the active layer structure toward the substrate and thus can suppress the spectral-intensity-modulation due to the substrate-mode. The first-conduction-type, low-refractive-index layer 3 shown in FIG. 1 is one preferable example of such layer for suppressing spectral-intensity-modulation.

In view of suppressing the leakage of light from the active layer structure to the substrate, an average refractive index $n_{LIL1}$ at the emission wavelength of the first-conduction-type, low-refractive-index layer 3 is preferably selected so as to satisfy the inequality 1, shown in the above, together with a refractive index of the substrate $n_{sub}$ at the emission wavelength, and a real part $n_{clad1}$ of an average refractive index at the emission wavelength of the first-conduction-type clad layer.

Difference between $n_{sub}$ and $n_{clad1}$ ($n_{sub}-n_{clad1}$) is preferably larger than 0.1, and more preferably larger than 0.15. Difference between $n_{clad1}$ and $n_{LIL1}$ ($n_{clad1}-n_{LIL1}$) is preferably larger than 0.1, and more preferably larger than 0.12. It should now be noted that the refractive indices appear in this specification are calculated by the method described in Journal of Applied Physics, Vol. 58(3), 1985, R1–R29.

If the layer, such as the first-conduction-type, low-refractive-index layer 3, for suppressing spectral-intensity-modulation is not provided, the substrate 1 having a larger refractive index than that of the first-conduction-type clad layer 4, described later, may undesirably promote the light leakage from such first-conduction-type clad layer 4, to thereby induce the longitudinal-mode inherent to such substrate 1. Incorporating now the layer satisfying the inequality 1 into the device can substantially lower the refractive index of the substrate side as viewed from the first-conduction-type clad layer, to thereby successfully prevent the light leakage toward the substrate side.

Compositional materials and structures of the first-conduction-type, low-refractive-index layer 3 are not specifically be limited and can be appropriately selected so far as the relation expressed by the inequality 1 is satisfied. For example, the case with the substrate made of GaAs ($n_{sub}$=3.5252 at 980 nm) and the first-conduction-type clad layer made of $Al_{0.35}Ga_{0.65}As$ ($n_{clad1}$=3.3346 at 980 nm) can preferably employ the first-conduction-type, low-refractive-index layer of $Al_{0.7}Ga_{0.3}As$ ($n_{LIL1}$=3.1387 at 980 nm). The first-conduction-type, low-refractive-index layer can also employ a super-lattice structure, which is typified by stacked 40 pairs of an $Al_{0.6}Ga_{0.4}As$ layer of 10 nm thick (n=3.1951) and an $Al_{0.4}Ga_{0.6}As$ layer of 5 nm thick (n=3.3069). The average refractive index $n_{LIL1}$ in this case is given as 3.2324 [=(10×3.1951+5×3.3069)/(10+5)].

The thickness of the first-conduction-type, low-refractive-index layer is not specifically limited so far as such layer can substantially lower the refractive index of the substrate side as viewed from the first-conduction-type clad layer and prevent the light leakage toward the substrate, where it is preferable that the thickness $T_{LIL1}$ of such first-conduction-type, low-refractive-index layer satisfies the relation expressed by the above inequality 2 together with the emission wavelength λ. $T_{LIL1}$ is preferably larger than λ/10, and more preferably larger than λ/7.

Another candidate for the layer for suppressing spectral-intensity-modulation due to substrate-mode is a reflective region which can reflect light from the active layer structure back thereto. While the light emitted from the active layer may vary depending on various conditions such as temperature and output power, the reflective region in the context of this specification refers to the one capable of reflecting light having an oscillation wavelength obtained from the light emitting device of the present invention operated under the usual operational environment (e.g., operating temperature). For example, an excitation light source of 980=nm laser diode=EDFA used in a repeater for submarine cable systems operates at approx. 5 to 40. The device for use in terrestrial systems, provided with a temperature control function, can operate mainly at 25. It should now be noted that "reflection" in the context of this specification means capability of reflecting at least 0.05% or more of the incident light, more preferably 1% or more, still more preferably 5% or more, further more preferably 20% or more, and most preferably 30% or more.

Such reflective region reflects light back to the active layer structure, to thereby prevent the light from being penetrating into the substrate which is transparent at the oscillation wavelength, where wave-guiding therein unnecessarily causes adverse effect such as spectral-intensity-modulation. Structures and compositional materials for the reflective region are not specifically limited provided that the region can keep such functions.

The reflective region is generally designed to have a layered structure (layer-formed reflective layer will be referred to as "a reflective mirror layer" hereinafter). The reflective mirror layer is preferably positioned between the substrate and the first-conduction-type clad layer described later. The reflective mirror layer can also serve as a clad layer.

It is also allowable to divide the reflective mirror layer into a first reflective mirror layer and a second reflective mirror layer, and to locate such first reflective mirror layer between the substrate 1 and the first-conduction-type clad layer 4, and such second reflective mirror layer between the second-conduction-type second clad layer 7 and the contact layer 11, both of which will be described later. In such constitution, the first reflective mirror layer is responsible for preventing the light emitted from the active layer structure from penetrating into the substrate 1, and the second reflective mirror layer is responsible for preventing the light emitted from the active layer structure from penetrating into the contact layer 11.

It is also allowable that the first reflective mirror layer serves as the first-conduction-type clad layer, and the second reflective mirror layer serves as the second-conduction-type first clad layer and/or the second-conduction-type second-clad layer.

While the reflective mirror layer can be composed of a single layer having a relatively large refractive index, the layer may have a distributed feedback structure composed of several layers differ in the individual refractive indices thereof. For the case with the distributed feedback structure and the substrate made of GaAs, an alternative stack of GaAs layers and $Al_xGa_{1-x}As$ layers is preferably used.

Figure 3:
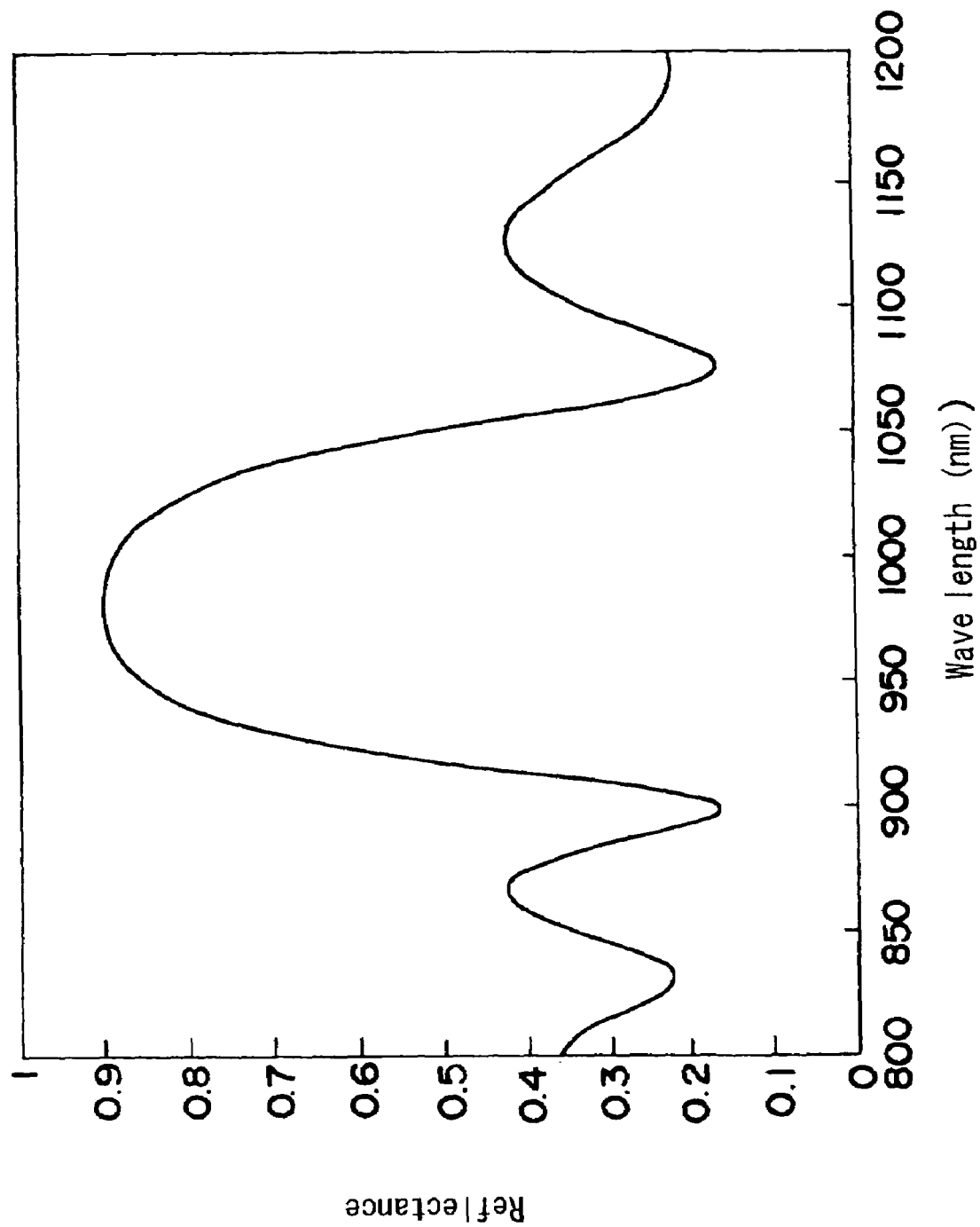
FIG. 3 is a spectral chart showing a relation between wavelength of incident light toward the reflective region and reflectance.

Wavelength band of light reflected by such reflective mirror layer may be appropriately selected depending on the purpose of use of the light emitting device. For example, a stack composed of 10 pairs of an $Al_{0.77}Ga_{0.23}As$ layer of 78.6 nm thick and a GaAs layer of 68.9 nm thick on the GaAs substrate will give wavelength dependence of the reflectance with respect to an incident light coming from the air opposite to the GaAs substrate as shown FIG. 3.

Figure 4:
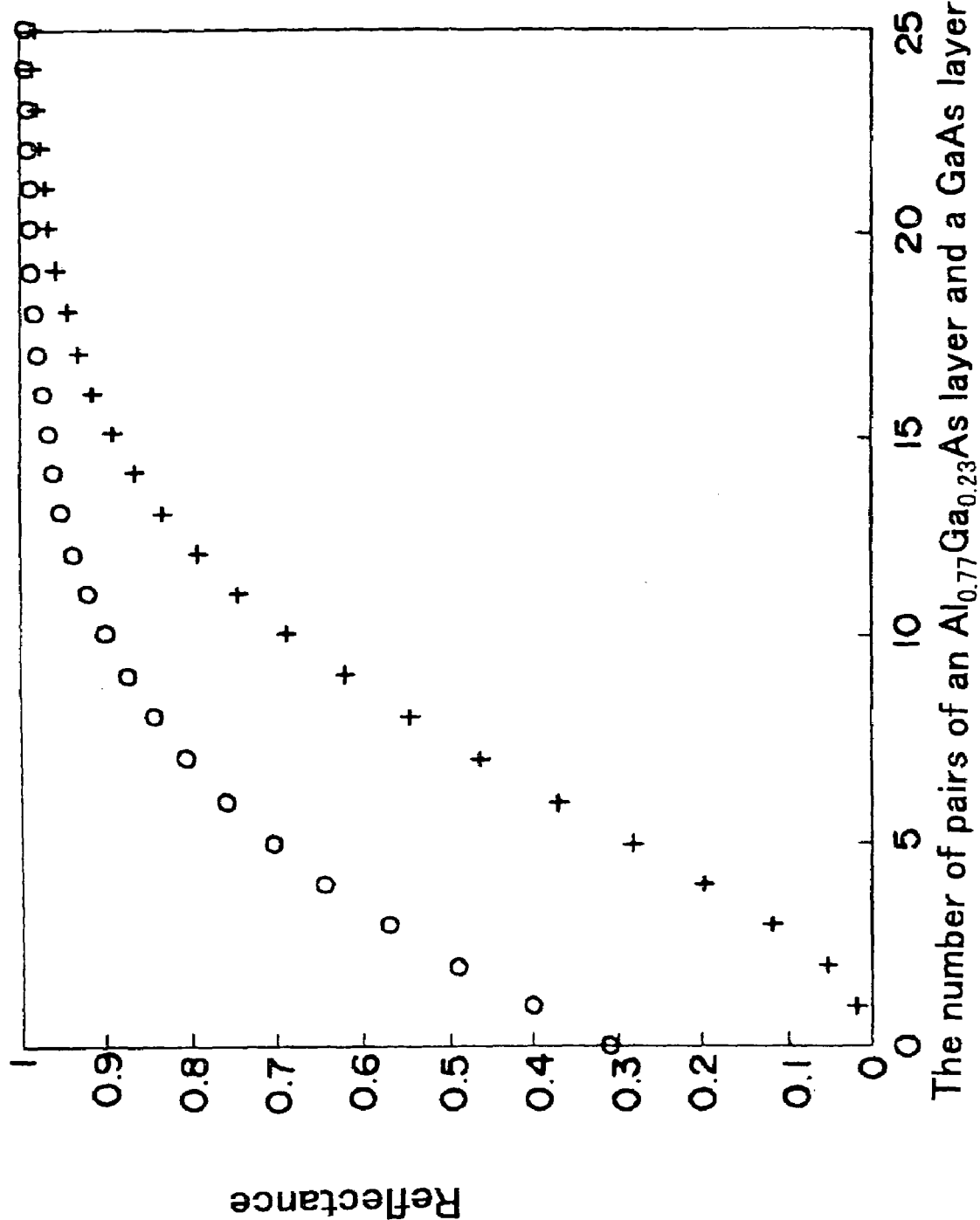
FIG. 4 is a chart showing a relation between the number of pairs of $Al_{0.77}Ga_{0.23}As$ layer and GaAs layer composing the reflective region and reflectance.

The reflectance at 980 m for the incident light coming from the air as expressed by a function of the number of pairs of the $Al_{0.77}Ga_{0.23}As$ layer and the GaAs layer is plotted with open circles (○) in FIG. 4, and the reflectance for the incident light coming from the GaAs substrate is plotted with crosses (+). Preliminarily obtaining such data will help the fabrication of a semiconductor laser diode having desired functions.

The reflective mirror layer is preferably designed to reflect light at oscillation wavelength as well as nearby longitudinal modes, rather than reflecting light of the oscillation wavelength only. It is preferable that the oscillation wavelength is always reflected by the reflective mirror in the operating temperature and output range of the light emitting device and that the reflective mirror has a high.

Specific constitutions of the light emitting device having such reflective region include such that replacing the first-conduction-type, low-reflective-index layer of a semiconductor laser diode of Example described later with a first reflective region [for example, 8 pairs of an n-type $Al_{0.77}Ga_{0.23}As$ layer of 78.6 nm thick and a GaAs layer of 68.9 nm thick having a carrier concentration of $1\times10^{18}/cm^3$]; and such that replacing the same layer with a second reflective region [for example, 5 pairs of an n-type $In_{0.5}Ga_{0.5}P$ layer of 74.0 nm thick and a GaAs layer of 68.9 nm thick having a carrier concentration of $1\times10^{18}/cm^3$; or 8 pairs of a p-type $Al_{0.77}Ga_{0.23}As$ layer of 78.6 nm thick and a GaAs layer of 68.9 nm thick having a carrier concentration of $1\times10^{18}/cm^3$].

The first-conduction-type clad layer 4 is generally composed of a material having a refractive index smaller than that of the average refractive index of the active layer structure, and such material is appropriately selected depending on the substrate 1, buffer layer 2, first-conduction-type, low-refractive-index layer 3 and active layer structure 5, all of which are collected to obtain a desired oscillation wavelength. For example, the case with the substrate 1 made of GaAs and the buffer layer 2 also made of GaAs, the first-conduction-type clad layer 4 can be made of AlGaAs-base material, InGaAs-base material, AlGaInP-base material and InGaP-base material.

The thickness of the first-conduction-type clad layer 4, in particular in the presence of the first-conduction-type, low-refractive-index layer 3, is preferably 0.5 to 5 μm, and more preferably 2.0 to 3.5 μm.

As has been described in the above, the entire portion or a part of the clad layer may incorporate the reflective region (reflective mirror layer) for reflecting light of a specific wavelength coming from the active layer structure. Such reflective region is to return the light within the clad layer, and can successfully prevent the light from penetrating into the substrate together with the first-conduction-type, low-refractive-index layer 3. It is also allowable to compose a part or the entire portion of the clad layer with a super-lattice structure.

The active layer structure 5 may be appropriately selected in view of desired emission wavelength and device characteristics, where the substrate must be transparent at such emission wavelength.

In view of material selection for the active layer per se, the case with the substrate 1 made of GaAs prefers a material of InGaAs-base, AlGaInAs-base or InGaAsP base. The active layer structure 5 is preferably made of an In-containing material. Most preferable is an InGaAs-base material and InGaN-base material. This is because a GaAs substrate and an $Al_2O_3$ substrate are transparent at the oscillation wavelength obtainable from the InGaAs-base material and the InGaN-base material, respectively.

The active layer may have various forms including bulk or quantum-well. At least a part of the active layer structure 5 preferably contains an n-type dopant. This allows stable operation of the laser diode of the present invention especially in a coupled form with an external cavity, and allows an excellent linearity in the light output over a wide range of temperature and output power.

In particular for the case that the active layer structure includes quantum-wells, the structure preferably includes at least a layer serving as an optical guide or a barrier and an active layer, and preferably contains in a part thereof an n-type dopant. The number and order of stacking of the optical guide layer, barrier layer and active layer are be arbitrarily selected and combined so as to allow the individual layers to fully exhibit the functions thereof. Also a portion to which an n-type dopant is included can be arbitrarily selected.

Specifically, the active layer structure 5 may be composed of an ordinary bulk active layer comprising a single layer, or may have a quantum-well structure such as a single quantum-well (SQW) structure, double quantum-well (DQW) structure or multiple quantum-well (MQW) structure. Other possible structures include such that providing guide optical guide layers on both sides of a quantum-well (SCH: Separate Confinement Heterostructure), and such that introducing compositional gradient of the optical guide layer to thereby grade the refractive index (GRIN-SCH:: Graded Index SCH).

The active layer may have a strained quantum-well structure for improved laser characteristics. It is also allowable to select a material for the optical guide layer having a strain inverse to that of the quantum-well layer to thereby cancel the strain of the active layer as a whole. A material for composing the optical guide layer can be selected depending on the active layer, examples of which include those of AlGaAs-base, InGaAs-base, InGaP-base, AlGaInP-base, AlInGaAs-base, InGaAsP-base and GaAsP-base. It is also allowable to compose the optical guide layer with a supper-lattice structure based on an arbitrary combination of the above materials. It is still also allowable to intentionally insert a material layer having a large band gap between the quantum-well layer and optical guide layer to thereby improve the temperature characteristics.

The second-conduction-type first clad layer 6 and the second-conduction-type second clad layer 7 are generally composed of a material having a refractive index smaller than that of the average refractive index of the active layer structure 5, similarly to the first-conduction-type clad layer 4, and such material is appropriately selected depending on the substrate 1, buffer layer 2 and active layer structure 5. For example, the case with the substrate 1 made of GaAs and the buffer layer 2 also made of GaAs, the clad layers 6 and 7 can be made of AlGaAs-base material, InGaAs-base material, InGaP-base material, AlGaInP-base material, AlInGaAs-base material, InGaAsP-base material or GaAsP-base material.

The entire portion or a part of these layers may be provided with a reflective region (reflective mirror) capable of reflecting light in a specific band coming from the side active layer structure in order to suppress penetration of the light into the contact layer described later. Such suppression of the light penetration into the contact layer is effective in particular for the case that the contact layer is as thick as exceeding 10 μm, and that the refractive index $n_{cont}$ of the contact layer is larger than the real part $n_{clad2}$ of the average refractive index at the emission wavelength of the second-conduction-type first clad layer and the second-conduction-type second clad layer.

The current block layer 8 is expected to block current, as the name suggests, to thereby substantially stop the conduction, so that it is preferable to select the conduction type thereof same as that of the first-conduction-type clad layer 4, or to remain the layer undoped. For the case that the current block layer 8 is made of an AlGaAs-base material, the refractive index thereof is preferably smaller than that of the second-conduction-type second clad layer 7 made of $Al_yGa_{1-y}As$ (0<y 1). That is, assuming the composition of the current block layer 8 as $Al_zGa_{1-z}As$ (0<z 1), Al content is preferably based on a relation of z>y. Considering such relation of y and z, the present invention is preferably applied mainly to semiconductor laser diode, in particular to those in which light is guided solely by the fundamental mode inherent to the laser structure per se. In this point of view, a transversal effective refractive index step mainly defined by a difference between refractive indices of the current block layer 8 and the second-conduction-type second clad layer 7 preferably has an order of $10^{-3}$. It is preferable to provide the cap layer 9 on the current block layer 8.

The refractive index of the second-conduction-type second clad layer 7 generally equals to or smaller than the refractive index of the active layer structure 5, and generally equals to those of the first-conduction-type clad layer 4 and the second-conduction-type first clad layer 6. For the case that all or a part of these layers are composed as the reflective mirror layer, the average refractive indices of the individual layers are preferably equalized.

The thickness of the second-conduction-type second clad layer 7 is preferably 0.5 to 5 µm, and more preferably 2.0 to 3.5 µm, when the second-conduction-type, low-refractive-index layer 10 described later is formed.

It is also allowable to provide the reflective mirror layer on the second-conduction-type second clad layer 7 in order to suppress penetration of the light into the contact layer 11 described later.

It is preferable to provide the second-conduction-type, low-refractive-index layer 10 between the second-conduction-type second clad layer and the contact layer 11. The layer 10 is provided to suppress the penetration of the light into the contact layer 11 as described in the above, and is effective in particular for the case that the contact layer is as thick as exceeding 10 µm, and that the refractive index $n_{cont}$ of the contact layer is larger than the real part $n_{clad2}$ of the average refractive index at the emission wavelength of the second-conduction-type first clad layer and the second-conduction-type second clad layer.

While the above description dealt with the case that the second-conduction-type clad layer is divided into the first and second clad layers, the second-conduction-type clad layer may be composed of a single layer, where $n_{clad2}$ represents the refractive index of such single second-conduction-type clad layer.

In view of achieving the purpose of the second-conduction-type, low-refractive-index layer 10, a refractive index $n_{LIL2}$ at the emission wavelength of the second-conduction-type, low-refractive-index layer 10 is preferably selected so as to satisfy the inequality 3, shown in the above, together with a refractive index $n_{cont}$ at the emission wavelength of the contact layer, and a real part $n_{clad2}$ of an average refractive index at the emission wavelength of the second-conduction-type clad layer.

Difference between $n_{cont}$ and $n_{clad2}$ ($n_{cont}-n_{clad2}$) is preferably larger than 0.1, and more preferably larger than 0.15. Difference between $n_{clad2}$ and $n_{LIL2}$ ($n_{clad2}-n_{LIL2}$) is preferably larger than 0.1, and more preferably larger than 0.12.

With regard to the second-conduction-type, low-refractive-index layer 10, compositional materials, thickness, structure or the like thereof may be appropriately selected similarly to those of the first-conduction-type, low-refractive-index layer. In particular, the thickness $T_{LIL2}$ thereof preferably satisfies the inequality 4 described in the above where the oscillation wavelength is expressed as λ. $T_{LIL2}$ is preferably larger than λ/10, and more preferably larger than λ/7.

On the second-conduction-type, low-refractive-index layer 10, the contact layer 11 is preferably provided to lower the contact resistivity with the electrode 12. The contact layer 11 is generally composed of a GaAs-base material. The layer is generally designed to have a carrier density higher than those in other layers in order to suppress the contact resistivity with the electrode. The thickness of the contact layer 11 may be appropriately selected, where a relatively large thickness thereof enhances effectiveness of the second-conduction-type, low-refractive-index layer 10.

The thickness of the individual layers composing the light emitting device may be appropriately selected within a range in which functions of the individual layers can be fully exhibited. As for the semiconductor laser diode shown in FIG. 1, the general thickness of the buffer layer 2 is selected within a range from 0.1 to 3 µm, the first-conduction-type clad layer 4 from 0.5 to 5 µm, the active layer structure 5 for the case having a quantum-well structure from 0.5 nm to 0.02 µm per layer, the second-conduction-type first clad layer 6 from 0.05 to 0.3 µm, the second-conduction-type second clad layer 7 from 0.5 to 5 µm, the current block layer 8 from 0.3 to 2 µm, the cap layer 9 from 5 nm to 0.5 µm, and the contact layer 11 from 1 to 25 µm.

The semiconductor laser diode shown in FIG. 1 is completed by forming the electrodes 12 and 13. For the case of forming the electrode 12 as a p-type electrode on the epitaxial layer side, the electrode can be formed by evaporating Ti, Pt and Au layers in this order on the surface of the contact layer 11, and then alloying these layers. On the other hand, for the case of forming the electrode 13 as an n-type electrode on the substrate 1, the electrode can be formed by evaporating AuGe, Ni and Au layers in this order on the surface of the substrate 1, and then alloying these layers.

Thus produced semiconductor wafer is then processed to form facets which serves as edge emission. The present invention is preferably applied to a device based on edge emission while being not limited thereto. The facets serve as mirrors composing a cavity of the semiconductor laser diode. The facets are preferably formed by cleavage which is a method widely accepted. Crystal plane appears on the facet after the cleavage varies depending on the orientation of the substrate. For example, when a device such as a laser diode of the edge emission type is fabricated on a substrate having a plane cyrstallographically equivalent to the widely-accepted nominally (100) plane, the (110) plane or a plane cyrstallographically equivalent thereto will be a plane for composing the cavity. On the other hand, for the case that an off-angled substrate is used, the facet may not be normal to the axial direction of the cavity depending on a relation between the angle of the inclination and the axial direction of the cavity. For example, using a substrate inclined by 2° from the (100) substrate in the (1–10) direction will produce the facet inclined similarly by 2°.

In the present invention, it is preferable to form on the exposed semiconductor facets coated layers 15 and 16 made of a dielectric material, or a combination of a dielectric and semiconductor materials (FIG. 2). The coated layers 15 and 16 are provided for two major purposes; one is to raise the optical output efficiency of the light from the semiconductor laser diode, and the other is to protect the facets. In order to enhance the coupling with an external cavity described later, it is also preferable to provide asymmetric coating in which a coated layer having a low reflectance (10% or less, for example) at the oscillation wavelength is provided on the front facet, and a coated layer having a high reflectance (80% or more, for example) on the rear facet. This is quite important to effectively introduce the light returned from the external cavity which is used for further stabilizing the wavelength. In particular for such purpose, the reflectance of the front facet is preferably 5% or below, and more preferably 2.5% or below.

Various materials are available for composing the coated layers 15 and 16. For example, one or combination of two or more materials selected from the group consisting of $AlO_x$, $TiO_x$, $SiO_x$, SiN, Si and ZnS can be used preferably. The coated layer having a low reflectance can be composed of $AlO_x$, $TiO_x$ or $SiO_x$, and the coated layer having a high reflectance can be composed of $AlO_x$/Si multi-layered coating or $TiO_x$/$SiO_x$ multi-layered coating. Appropriate adjustment of the thickness of the individual coatings will provide a desired reflectance. It is now a general practice to adjust the thickness of $AlO_x$, $TiO_x$ or $SiO_x$ layer for composing the low-reflectance coated layer approximately at $\lambda/4n$ or around, where $\lambda$ represents the emission wavelength and n represents a real part of the refractive index at such wavelength. Also for the high-reflectance multi-layered coating, it is a general practice to adjust the thickness of each layer composing such coating at $\lambda/4n$ or around.

As for methods for fabricating the basic epitaxial structure of various laser diodes typically illustrated in FIG. 1, Japanese Laid-Open Patent Publication 8-130344 will be a good reference. The laser diode of this type is typically used for a light source for an optical fiber amplifier used in optical communication, and can be further adopted to various applications by appropriately selecting the layer structure or compositional materials.

In order to achieve wavelength stabilization of the light emitting device according to the present invention, it is preferable to use an external mirror having a wavelength selectivity to thereby couple an external cavity and the light emitting device of the present invention. Such external cavity is most preferably composed of a fiber grating. The fiber grating allows appropriate selection of the center wavelength, reflection band or transmission band, and reflectance of the light toward the laser side inherent to such fiber grating depending on the purpose of use. The reflectance of the light toward the laser side inherent to the fiber grating is preferably 2 to 15% at the emission wavelength, and more preferably 5 to 10%; and the reflection band thereof preferably extends as far as 0.1 to 5.0 nm on both sides of the center wavelength, more preferably 0.5 to 1.5 nm.

EXAMPLES

The present invention will be now detailed referring to specific Examples. Materials, concentration, thickness, operational procedures and the like can be appropriately modified without departing from the spirit of the present invention. Thus it is to be understood that the present invention is by no means limited to the specific examples explained below.

Example 1

A groove-type semiconductor laser diode shown in FIGS. 1 and 2 was fabricated according to the procedures described below.

On the (100) plane of an n-type GaAs substrate with a carrier concentration of $1 \times 10^{18}$/cm$^3$ (refractive index=3.5252, at 980 nm; thickness=350 μm), sequentially grown by the MBE (molecular beam epitaxy) method were an n-type GaAs layer of 1 μm thick and having a carrier concentration of $1 \times 10^{18}$/cm$^3$ as a buffer layer 2 (refractive index=3.5252, at 980 nm); an n-type $Al_{0.7}Ga_{0.3}As$ layer of 0.15 μm thick having a carrier concentration of $1 \times 10^{18}$/cm$^3$ as a first-conduction-type, low-refractive-index layer 3 (refractive index=3.1387, at 980 nm); an n-type $Al_{0.35}Ga_{0.65}As$ layer of 1.5 μm thick having a carrier concentration of $1 \times 10^{18}$/cm$^3$ as a first-conduction-type clad layer 4 (refractive index=3.3346, at 980 nm); a stack of an n-type GaAs optical guide layer of 35 nm thick having a carrier concentration of $1 \times 10^{18}$/cm$^3$, an undoped $In_{0.16}Ga_{0.84}As$ strained quantum-well layer of 6 nm thick, and an n-type GaAs optical guide layer of 35 nm thick having a carrier concentration of $1 \times 10^{18}$/cm$^3$ as a strained single quantum-well active layer structure 5; a p-type $Al_{0.35}Ga_{0.65}As$ layer of 0.1 μm thick having a carrier concentration of $1 \times 10^{18}$/cm$^3$ as a second-conduction-type first clad layer 6 (refractive index=3.3346, at 980 nm); an n-type $Al_{0.39}Ga_{0.61}As$ layer of 0.5 μm thick having a carrier concentration of $5 \times 10^{17}$/cm$^3$ as a current block layer 8 (refractive index=3.3069, at 980 nm); and an n-type GaAs layer of 10 nm thick having a carrier concentration of $1 \times 10^{18}$/cm$^3$ as a cap layer 9. The n-type dopant employed herein was Si, and the p-type dopant was Be.

Then a mask made of silicon nitride was formed on the cap layer 9 selectively in the portion excluding that for the current injection area. The width of a stripe-patterned opening formed in the silicon nitride mask was 1.5 μm. Then the cap layer and the current block layer were etched at 25 for 27 seconds using an 1:1:5 (in volume ratio) mixed solution of sulfuric acid (98 wt %), hydrogen peroxide (30 wt % aqueous solution) and water, to thereby partially expose the second-conduction-type first clad layer. The wafer is then immersed into an 1:6 mixed solution of HF (49%) and $NH_4F$ (40%) for 2.5 minutes to thereby remove the silicon nitride mask.

Then a p-type $Al_{0.35}Ga_{0.65}As$ layer (refractive index=3.3346, at 980 nm) having a carrier concentration of $1 \times 10^{18}$/cm$^3$ was then grown by the MOCVD method as the second-conduction-type second clad layer 7 so as to have a thickness in the buried portion (current injection portion) of 1.5 μm; which was followed by successive growth of a p-type $Al_{0.7}Ga_{0.3}As$ layer (refractive index=3.1387, at 980 nm) of 0.15 μm thick having a carrier concentration of $1 \times 10^{18}$/cm$^3$ as the second-conduction-type, low-refractive-index layer 10; and a p-type GaAs layer (refractive index=3.5252, at 980 μm) of 7 μm thick having a carrier concentration of $1 \times 10^{19}$/cm$^3$ as the contact layer 11 for ensuring contact with the electrode. The p-type dopant used herein was Zn. The width W of the current injection portion (the width of the second-conduction-type second clad layer at the boundary with the second-conduction-type first clad layer) was 2.2 μm.

Difference between the refractive indices of the current block layer 8 and the second-conduction-type second clad layer 7, and the width W were designed so as to permit only the fundamental-mode as a mode, which was achieved by determining the Al content of the clad layer, current block layer or so.

Then the substrate was polished to reduce the thickness thereof as thin as 100 μm, and an AuGe/Ni/Au stacked coating was evaporated as the n-type electrode 13 on the substrate side, and an Ti/Pt/Au stacked coating was evaporated as the p-type electrode 12 on the epitaxial layer side; and the electrodes 12 and 13 were alloyed at 400 for 5 minutes to thereby complete the semiconductor wafer.

The wafer is then cleaved in air to produce a laser diode bar having a cavity length of 700 μm and (10) planes exposed at the both facets. An $AlO_x$ coating of 165 nm thick was then formed in vacuum on one exposed plane to be the front facet so as to have a reflectance of 2.5% at 980 nm, to thereby form the coated layer 15.

The laser diode bar was once taken out from the vacuum chamber, and the coated layer 16 comprising four layers of an $AlO_x$ layer of 170 μm thick, an amorphous Si layer of 60 μm thick, an $AlO_x$ layer of 170 μm thick and an amorphous Si layer of 60 μm thick stacked in this order was formed on the other facet, to thereby form the rear facet having a reflectance of 92%.

Figure 5:
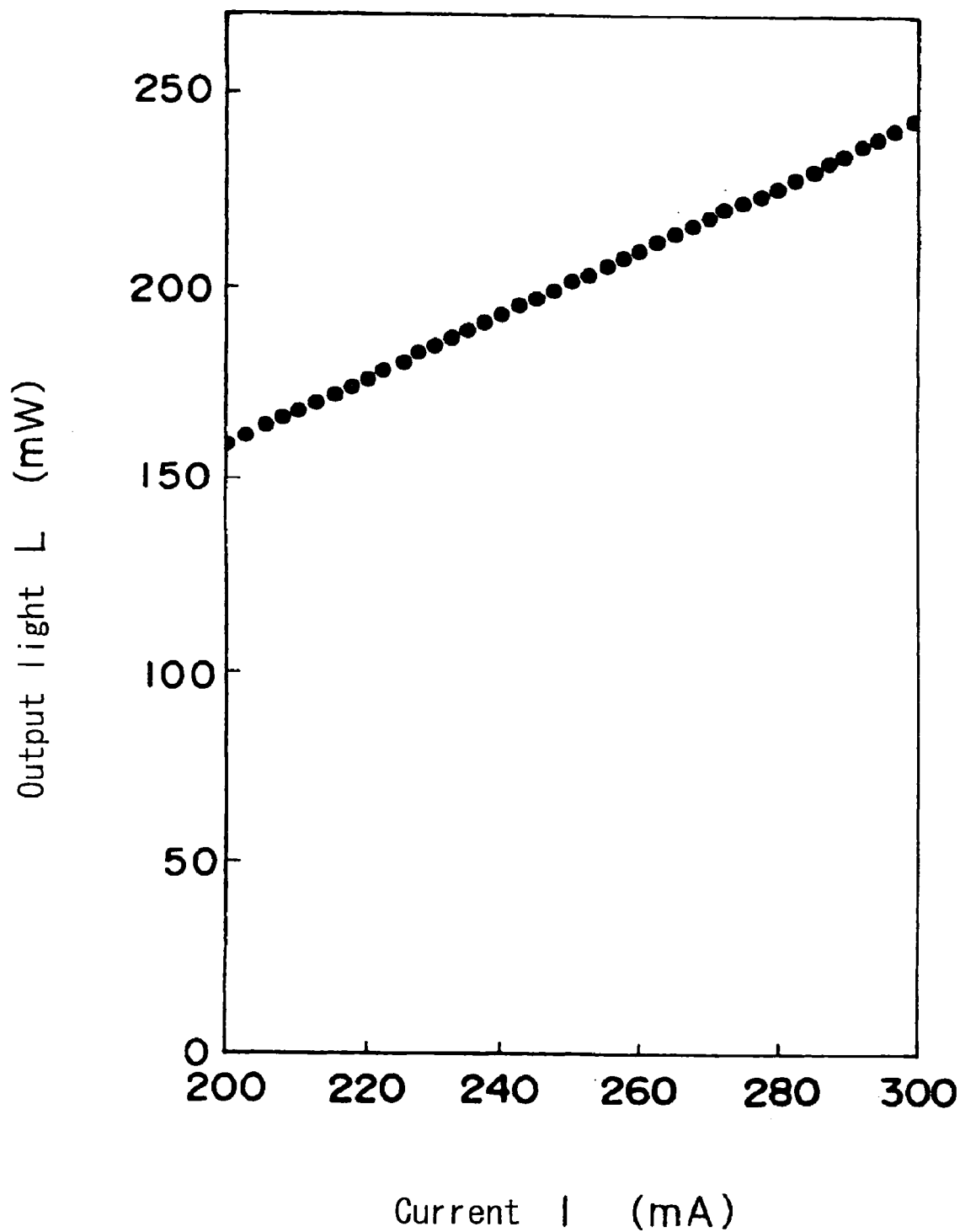
FIG. 5 is a graph showing current-light output characteristics of the semiconductor laser diode of Example 1.
Figure 6:
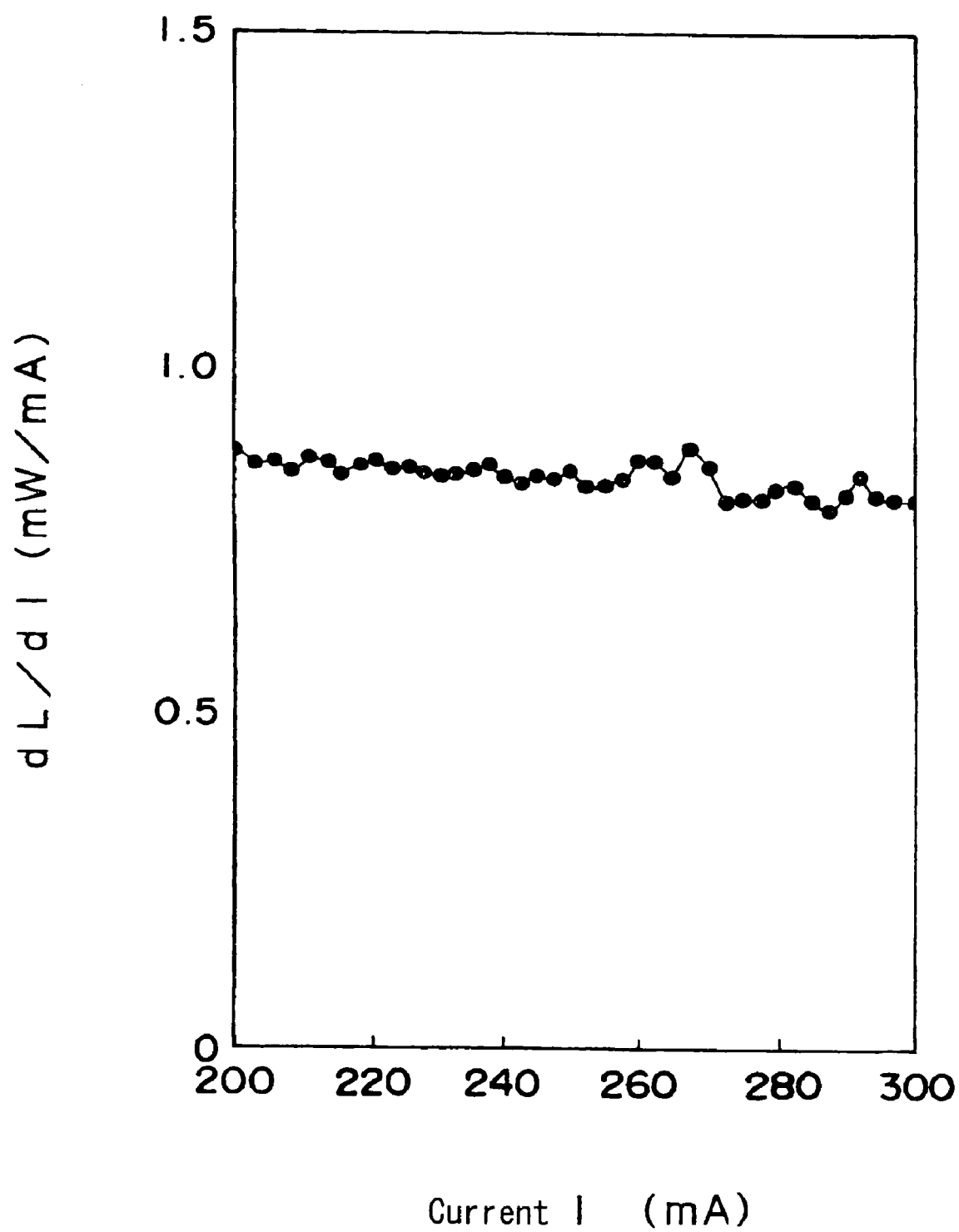
FIG. 6 is a graph showing a relation between the current and slope efficiency of the semiconductor laser diode of Example 1.

FIG. 5 shows current-light output characteristics of the obtained semiconductor laser diode measured in detail at 25 over a range from 200 to 300 mA. FIG. 6 shows differential of such measured values [slope efficiency (W/A)]. It was confirmed from FIG. 5 that the light output increases in a linear relation with the injected current. It was also confirmed that fluctuation in the slope efficiency is as small as within ±0.05 (W/A).

Figure 7:
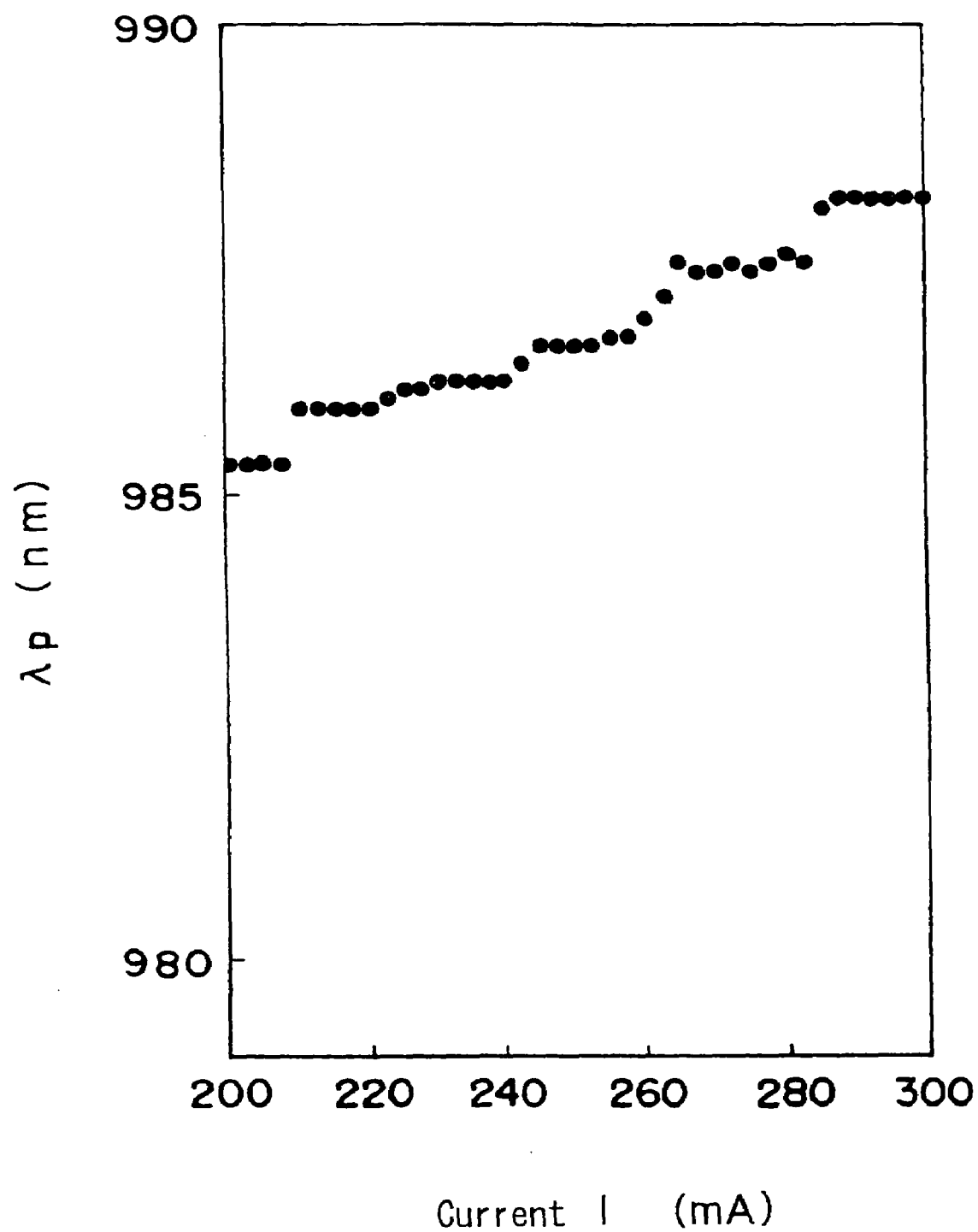
FIG. 7 is a graph showing a relation between current and peak wavelength $\lambda_p$ of the semiconductor laser diode of Example 1.
Figure 8:
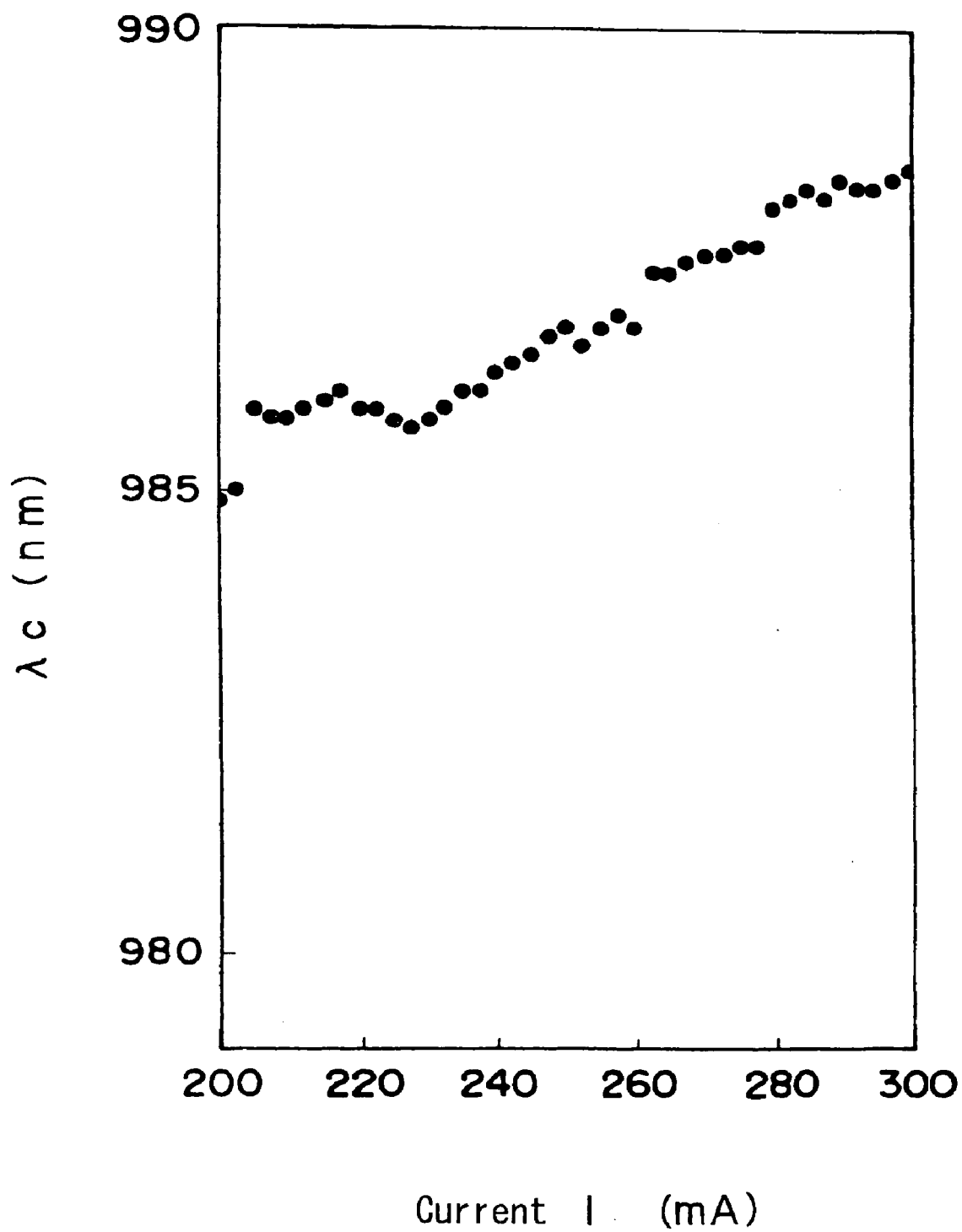
FIG. 8 is a graph showing changes in center wavelength $\lambda_c$ of the semiconductor laser diode of Example 1.

Changes in the peak wavelength $\lambda_p$ and the center wavelength $\lambda_c$ were also measured over the same current range. Results were shown in FIGS. 7 and 8, respectively. Now the peak wavelength $\lambda_p$ refers to a wavelength providing a maximum relative intensity, and the center wavelength $\lambda_c$ refers to a center of a full range of the spectrum. It was confirmed that both of $\lambda_p$ and $\lambda_c$ showed red-shifting trends in a relatively linear manner, and hops in wavelength were observed only as large as 1 nm or below. Spectral-intensity-modulation with a large wavelength spacing affected by the substrate-mode was not observed.

A semiconductor laser module was then fabricated by placing at the front facet of the laser diode a grating fiber having a reflectance of 6.5% at 981 nm and a reflection band of 1 nm. The tracking error of the entire semiconductor laser diode module under variable environmental temperature was then measured using light output from the grating fiber as a parameter. Tracking error is now defined as fluctuation in the light output from the fiber when the light output is regulated at a constant value using a built-in photodiode, which can provide a good index for judging coupling characteristics with an external cavity.

When observed under fiber-end light outputs controlled at 100, 140 and 180 mW using the built-in photodiode, and temperature varied within a range from 5 to 40, the tracking error was found to be suppressed successfully within a range of ±0.3 dB.

Example 2

The semiconductor laser diode was fabricated similarly to Example 1, except that the second-conduction-type, low-refractive-index layer 10 is not provided and that the thickness of the contact layer 11 was reduced to 3.5 μm.

Current-light output characteristics of the obtained semiconductor laser diode were measured in detail at 25 over a range from 200 to 300 mA, which revealed linear increase in the light output in relation to the injected current. It was also confirmed that fluctuation in the slope efficiency is as small as within ±0.06 (W/A).

Changes in the peak wavelength $\lambda_p$ and the center wavelength $\lambda_c$ were also measured over the same current range. It was confirmed that both of $\lambda_p$ and $\lambda_c$ showed red-shifting trends in a relatively linear manner, and hops in wavelength were observed only as large as 0.7 nm or below. Spectral-intensity-modulation with a large wavelength spacing affected by the substrate-mode was not observed.

A semiconductor laser module was then fabricated similarly to Example 1, and the tracking error was measured.

When observed under fiber-end light outputs controlled at 100, 140 and 180 mW using the built-in photodiode, and temperature varied within a range from 5 to 40, the tracking error was found to be suppressed successfully within a range of ±0.35 dB.

Example 3

The semiconductor laser diode was fabricated similarly to Example 1, except that the second-conduction-type, low-refractive-index layer 10 is not provided and that the first-conduction-type, low-refractive-index layer 3 is composed of 50 pairs of an $Al_{0.6}Ga_{0.4}As$ layer of 10 nm thick (refractive index=3.1951) and an $Al_{0.4}Ga_{0.6}As$ layer of 5 nm thick (refractive index=3.3069) so as to have an average refractive index $n_{LH1}$ of 3.2324.

Current-light output characteristics of the obtained semiconductor laser diode were measured in detail at 25 over a range from 200 to 300 mA, which revealed linear increase in the light output in relation to the injected current. It was also confirmed that fluctuation in the slope efficiency is as small as within ±0.05 (W/A).

Changes in the peak wavelength $\lambda_p$ and the center wavelength $\lambda_c$ were also measured over the same current range. It was confirmed that both of $\lambda_p$ and $\lambda_c$ showed red-shifting trends in a relatively linear manner, and hops in wavelength were observed only as large as 0.6 nm or below. Spectral-intensity-modulation with a large wavelength spacing affected by the substrate-mode was not observed.

A semiconductor laser module was then fabricated similarly to Example 1, and the tracking error was measured.

When observed under fiber-end light outputs controlled at 100, 140 and 180 mW using the built-in photodiode, and temperature varied within a range from 5 to 40, the tracking error was found to be suppressed successfully within a range of ±0.32 dB.

Example 4

The semiconductor laser diode was fabricated similarly to Example 1, except that the thickness of the first-conduction-type clad layer 4 and the second-conduction-type second clad layer 7 were increased to 2.2 μm, and the thickness of the contact layer 11 was reduced to 3.5 μm.

Current-light output characteristics of the obtained semiconductor laser diode were measured in detail at 25 over a range from 200 to 300 mA, which revealed linear increase in the light output in relation to the injected current. It was also confirmed that fluctuation in the slope efficiency is as small as within ±0.04 (W/A).

Changes in the peak wavelength $\lambda_p$ and the center wavelength $\lambda_c$ were also measured over the same current range. It was confirmed that both of $\lambda_p$ and $\lambda_c$ showed red-shifting trends in a relatively linear manner, and hops in wavelength were observed only as large as 0.5 nm or below. Spectral-intensity-modulation with a large wavelength spacing affected by the substrate-mode was not observed.

A semiconductor laser module was then fabricated similarly to Example 1, and the tracking error was measured.

When observed under fiber-end light outputs controlled at 100, 140 and 180 mW using the built-in photodiode, and temperature varied within a range from 5 to 40, the tracking error was found to be suppressed successfully within a range of ±0.27 dB.

Example 5

The semiconductor laser diode was fabricated similarly to Example 1, except that the thickness of the substrate was reduced to 50 μm.

Current-light output characteristics of the obtained semiconductor laser diode were measured in detail at 25 over a range from 200 to 300 mA, which revealed linear increase in the light output in relation to the injected current. It was also confirmed that fluctuation in the slope efficiency is as small as within ±0.035 (W/A).

Changes in the peak wavelength $\lambda_p$ and the center wavelength $\lambda_c$ were also measured over the same current range. It was confirmed that both of $\lambda_p$ and $\lambda_c$ showed red-shifting trends in a relatively linear manner, and hops in wavelength were observed only as large as 0.4 nm or below. Spectral-intensity-modulation with a large wavelength spacing affected by the substrate-mode was not observed.

A semiconductor laser module was then fabricated similarly to Example 1, and the tracking error was measured.

When observed under fiber-end light outputs controlled at 100, 140 and 180 mW using the built-in photodiode, and temperature varied within a range from 5 to 40, the tracking error was found to be suppressed successfully within a range of ±0.28 dB.

Example 6

The semiconductor laser diode was fabricated similarly to Example 1, except that the first-conduction-type, low-refractive-index layer 3 and the second-conduction-type, low-refractive-index layer 10 were not provided and that the thickness of the substrate was reduced to 70 μm by polishing.

Current-light output characteristics of the obtained semiconductor laser diode were measured in detail at 25 over a range from 250 to 300 mA, and fluctuation in the differential thereof [slope efficiency (W/A)] was evaluated. It was confirmed that the light output linearly increases with the injected current, and that fluctuation in the slope efficiency is as small as within ±0.07 (W/A).

Changes in the peak wavelength $\lambda_p$ and the center wavelength $\lambda_c$ were also measured over the same current range. It was confirmed that both of $\lambda_p$ and $\lambda_c$ showed red-shifting trends in a relatively linear manner, and hops in wavelength were observed only as large as 0.8 nm or below. Spectral-intensity-modulation with a large wavelength spacing affected by the substrate-mode was not observed.

When observed under fiber-end light outputs controlled at 100, 140 and 180 mW using the built-in photodiode, and temperature varied within a range from 5 to 35, the tracking error was found to be suppressed successfully within a range of ±0.4 dB.

Comparative Example 1

The semiconductor laser diode was fabricated similarly to Example 1, except that the first-conduction-type, low-refractive-index layer 3 and the second-conduction-type, low-refractive-index layer 10 were not provided.

Figure 9:
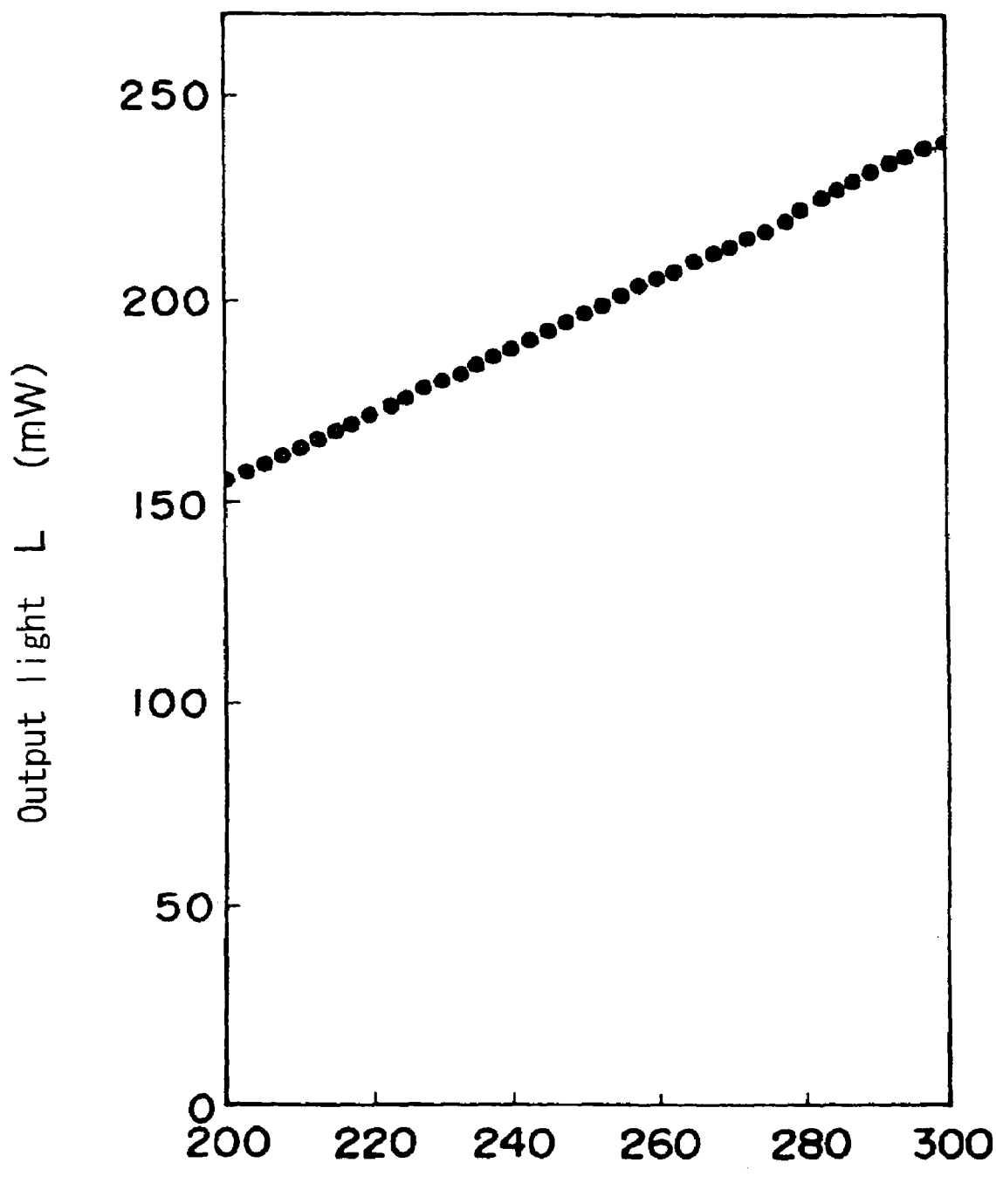
FIG. 9 is a graph showing current-light output characteristics of a semiconductor laser diode of Comparative Example 1.
Figure 10:
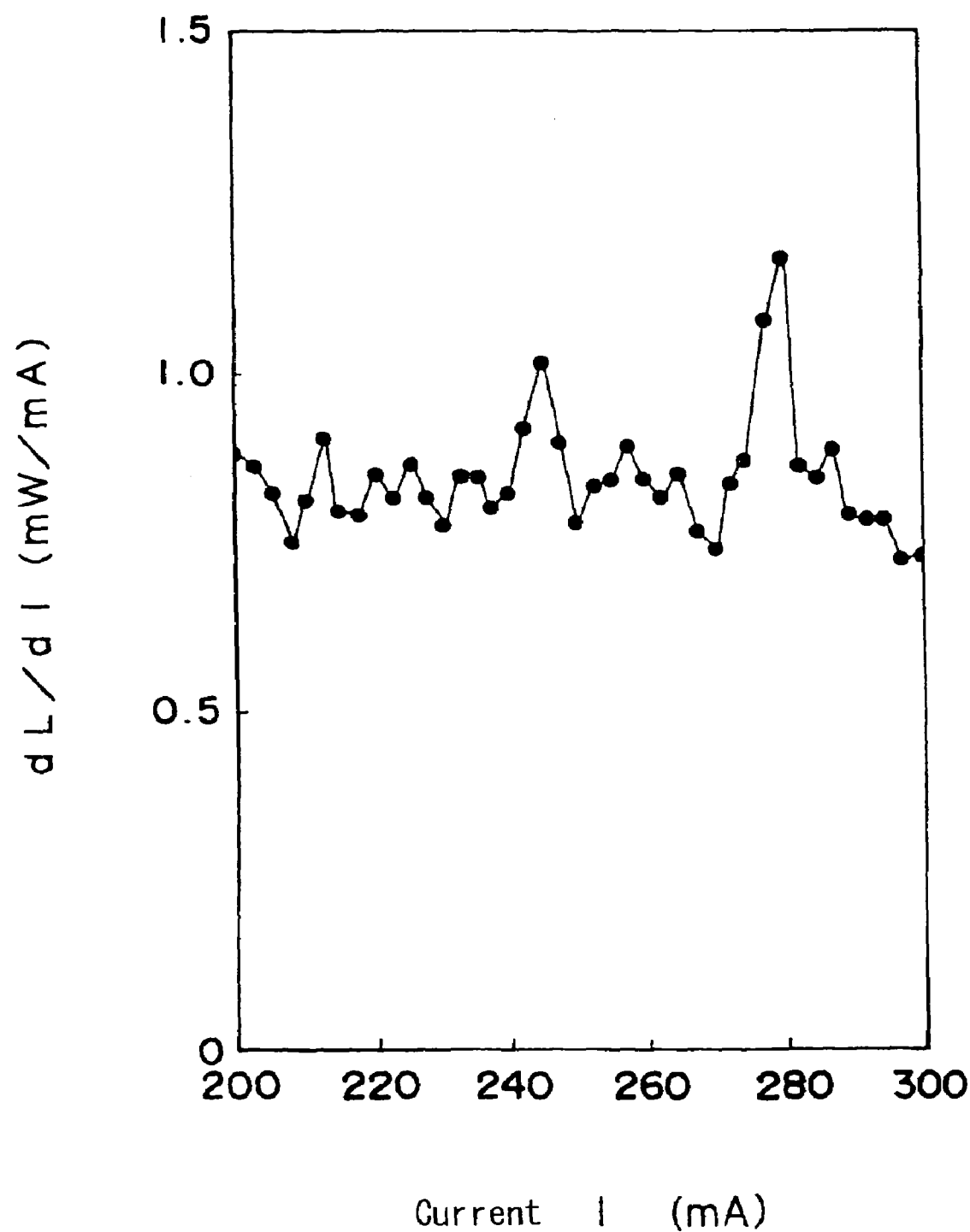
FIG. 10 is a graph showing a relation between current and slope efficiency of the semiconductor laser diode of Comparative Example 1.

FIG. 9 shows current-light output characteristics of the obtained semiconductor laser diode measured in detail at 25 over a range from 200 to 300 mA. FIG. 10 shows differential of such measured values [slope efficiency (W/A)]. It was confirmed from FIG. 9 that the relation between the injected current and light output lacks linearity typically at 280 mA or around. Fluctuation in the slope efficiency was considerably large over the entire current range, in which a maximum value exceeded 1.15 W/A, and a minimum value was lower than 0.75 W/A.

Figure 11:
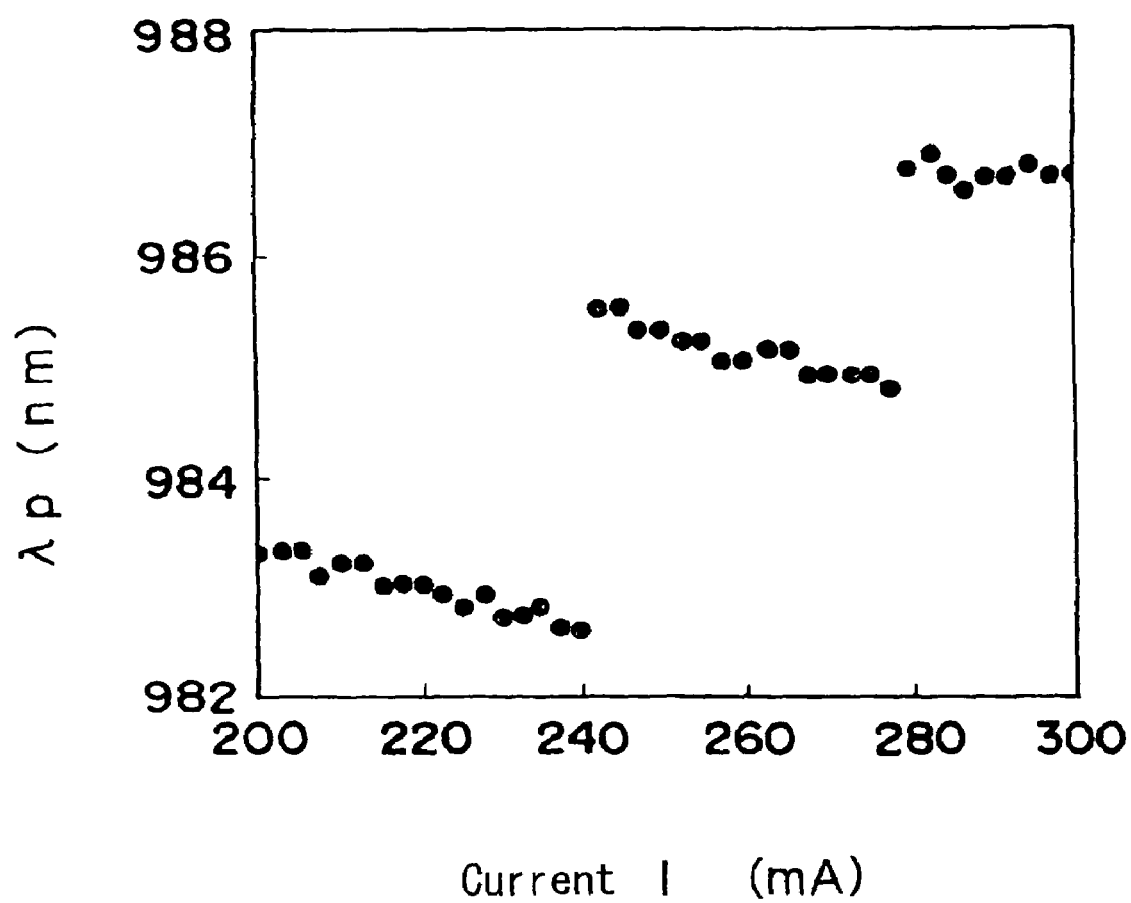
FIG. 11 is a graph showing changes in peak wavelength $\lambda_p$ of the semiconductor laser diode of Comparative Example 1.
Figure 12:
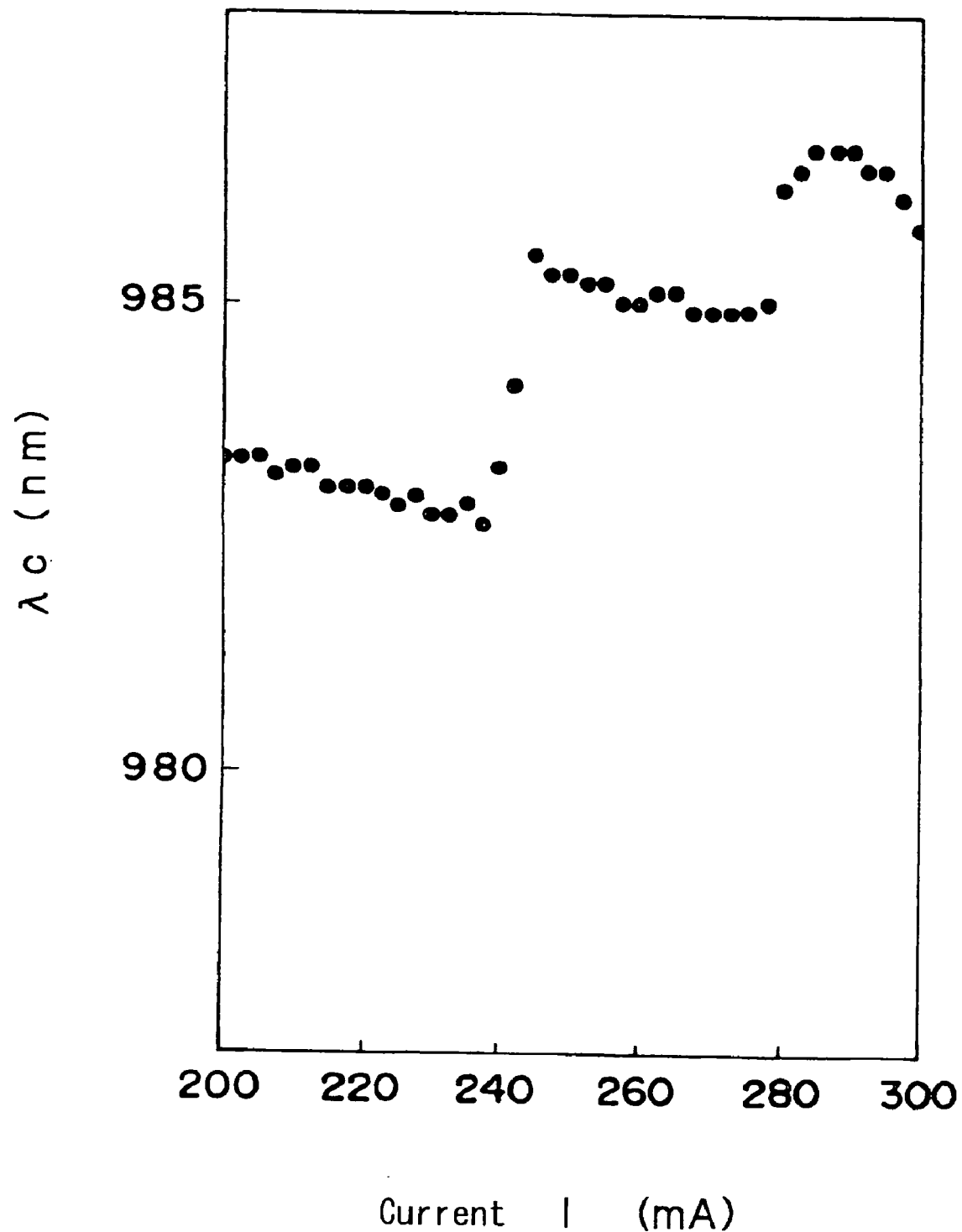
FIG. 12 is a graph showing changes in center wavelength $\lambda_c$ of the semiconductor laser diode of Comparative Example 1.

Changes in the peak wavelength $\lambda_p$ and the center wavelength $\lambda_c$ were also measured over the same current range. Results were shown in FIGS. 11 and 12. Both of $\lambda_p$ and $\lambda_c$ showed stepwise changes, and spectral-intensity-modulation with a large wavelength spacing affected by the substrate-mode was observed. It was confirmed that the maximum distance hop in wavelength reached approx. 2.8 nm.

A semiconductor laser module was then fabricated similarly to Example 1, and the tracking error was measured.

When observed under fiber-end light outputs controlled at 100, 140 and 180 mW, and temperature varied within a range from 5 to 40, the tracking error was found to be as large as ±0.6 dB.

Comparative Example 2

The semiconductor laser diode was fabricated similarly to Example 6, except that the thickness of the substrate was reduced to 120 μm.

Current-light output characteristics of the obtained semiconductor laser diode were measured in detail at 25 over a range from 250 to 300 mA, and fluctuation in the differential thereof [slope efficiency (W/A)] was evaluated. The relation between the injected current and light output was found to have a partial non-linearity. Fluctuation in the slope efficiency was considerably large over the entire current range, in which a maximum value exceeded 1.1 W/A, and a minimum value was lower than 0.72 W/A.

Changes in the peak wavelength $\lambda_p$ and the center wavelength $\lambda_c$ were also measured over the same current range. Both of $\lambda_p$ and $\lambda_c$ showed stepwise changes, and spectral-intensity-modulation with a large wavelength spacing affected by the substrate-mode was observed. It was confirmed that the maximum distance hop in wavelength reached approx. 2.8 nm.

A semiconductor laser module was then fabricated similarly to Example 6, and the tracking error was measured.

When observed under fiber-end light outputs controlled at 100, 140 and 180 mW, and temperature varied within a range from 5 to 40, the tracking error was found to be as large as ±0.65 dB.

INDUSTRIAL APPLICABILITY

The light emitting device of the present invention can suppress the competition of the longitudinal-modes and spectral-intensity-modulation due to the substrate-mode, which are observed for the case the substrate is transparent at the emission wavelength, to thereby provide a light emission device excellent in linearity of the current-light output characteristics, and to thereby improve the coupling characteristics with an external cavity. A light emitting device module can operate in a stable manner over a wide range of temperature and output. The light emitting device and light emitting device module of the present invention are thus valuable in a vast range of applications.

What is claimed is:

1. A light emitting device comprising a substrate transparent at the emission wavelength and an active layer structure formed on such substrate, in which a layer for suppressing spectral-intensity-modulation due to the substrate-mode is provided between said substrate and said active layer structure, and further comprising:
a first-conduction-type clad layer having the same conduction type with said substrate and formed between said substrate and said active layer structure; and
a first-conduction-type, low-refractive-index layer formed between said substrate and said first-conduction-type clad layer,
wherein a relation expressed by the following inequality is satisfied:

$$n_{sub} > n_{clad1} > n_{LIL1} \quad \text{(inequality 1)}$$

where $n_{sub}$ represents the refractive index at the emission wavelength of said substrate, $n_{clad1}$ represents the real part of an average refractive index at the emission wavelength of said first-conduction-type clad layer, and $n_{LIL1}$ represents the average refractive index at the emission wavelength of said first-conduction-type, low-refractive-index layer.

2. The light emitting device as claimed in claim 1, wherein a relation expressed by the following inequality is satisfied:

$$T_{LIL1} > \lambda/20 \quad \text{(inequality 2)}$$

where $T_{LIL1}$ represents the thickness of said first-conduction-type, low-refractive-index layer, and $\lambda$ represents the emission wavelength.

3. The light emitting device as claimed in claim 1, wherein the thickness of said first-conduction-type clad layer is 2.0 to 3.5 μm.

4. The light emitting device as claimed in claim 1, further comprising:
a second-conduction-type clad layer formed on said active layer structure;
a second-conduction-type, low-refractive-index layer formed on said second-conduction-type clad layer; and
a contact layer formed on said second-conduction-type, low-refractive-index layer,
wherein a relation expressed by the following inequality is satisfied:

$$n_{cont} > n_{clad2} > n_{LIL2} \quad \text{(inequality 3)}$$

where $n_{clad2}$ represents the refractive index at the emission wavelength of said second-conduction-type clad layer, $n_{LIL2}$ represents the refractive index at the emission wavelength of said second-conduction-type, low-refractive-index layer, and $n_{cont}$ represents a refractive index at the emission wavelength of said contact layer.

5. The light emitting device as claimed in claim 4, wherein a relation expressed by the following inequality is satisfied:

$$T_{LIL2} > \lambda/20 \quad \text{(inequality 4)}$$

where $T_{LIL2}$ represents the thickness of said second-conduction-type, low-refractive-index layer, and $\lambda$ represents the emission wavelength.

6. The light emitting device as claimed in claim 4, wherein the thickness of said second-conduction-type clad layer is 2.0 to 3.5 μm.

7. The light emitting device as claimed in claim 1, wherein at least either one of said first-conduction-type clad layer or said second-conduction-type clad layer has a super-lattice structure.

8. The light emitting device as claimed in claim 1, wherein at least either one of said first-conduction-type, low-refractive-index layer or said second-conduction-type, low-refractive-index layer has a super-lattice structure.

9. The light emitting device as claimed in claim 1, wherein the thickness of said substrate is 75 μm or below.

10. The light emitting device as claimed in claim 9, wherein the thickness of said substrate is 50 μm or below.

11. The light emitting device as claimed in claim 1, further having between said substrate and said active layer structure a reflective region for reflecting light from such active layer structure.

12. The light emitting device as claimed in claim 11, wherein said reflective region has a distributed feedback structure.

13. The light emitting device as claimed in claim 12, wherein said reflective region reflects light having an oscillation wavelength of such light emitting device.

14. The light emitting device as claimed in claim 11, wherein said reflective region comprises a stack of a plurality of semiconductor layers mutually differ in refractive indices thereof.

15. The light emitting device as claimed in claim 14, wherein a plurality of said semiconductor layers contain GaAs and AlGaAs.

16. The light emitting device as claimed in claim 14, wherein a plurality of said semiconductor layers contain GaAs and $In_{0.5}Ga_{0.5}P$.

17. The light emitting device as claimed in claim 11, wherein said reflective layer is provided between said substrate and said first-conduction-type clad layer having the conduction type same as that of such substrate and formed between said active layer structure and said substrate.

18. The light emitting device as claimed in claim 17, wherein an additional reflective layer for reflecting light from said active layer structure is provided on the opposite side of said active layer structure as viewed from said substrate.

19. The light emitting device as claimed in claim 18, wherein said reflective region is provided between said second-conduction-type clad layer, differ in the a conduction type with said substrate, and said contact layer.

20. The light emitting device as claimed in claim 1, wherein said substrate comprises a dielectric material, and all other parts comprise semiconductor materials.

21. The light emitting device as claimed in claim 1, wherein all parts of such light emitting device comprise semiconductor materials.

22. The light emitting device as claimed in claim 1 having an edge-emission structure.

23. The light emitting device as claimed in claim 22 having on both facets thereof a coated layer composed of a dielectric material or a combination of a dielectric material and semiconductor material, one of said facet having a reflectance at the oscillation wavelength of 10% or below, and the other facet 80% or above.

24. The light emitting device as claimed in claim 1 operating as a laser device.

25. The light emitting device as claimed in claim 24 operating as a laser diode which comprises a GaAs substrate and a strained quantum-well active layer provided thereon and containing In, Ga and As as compositional elements.

26. The light emitting device as claimed in claim 1, wherein said active layer structure has a layer functioning as an optical guide or a barrier, and at least a part of such active layer structure contains an n-type dopant.

* * * * *